(12) United States Patent
Kajiyama

(10) Patent No.: US 7,205,564 B2
(45) Date of Patent: Apr. 17, 2007

(54) RESISTANCE CHANGE MEMORY HAVING ORGANIC SEMICONDUCTOR LAYER

(75) Inventor: Takeshi Kajiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 232 days.

(21) Appl. No.: 10/979,327

(22) Filed: Nov. 3, 2004

(65) Prior Publication Data
US 2005/0146955 A1 Jul. 7, 2005

(30) Foreign Application Priority Data
Nov. 11, 2003 (JP) ............................. 2003-381435

(51) Int. Cl.
*H01L 29/08* (2006.01)
*G11C 11/00* (2006.01)

(52) U.S. Cl. ......................................... 257/40; 365/158
(58) Field of Classification Search .................. 257/40, 257/295, 421, 427; 365/158
See application file for complete search history.

(56) References Cited

U.S. PATENT DOCUMENTS 6,269,018 B1  7/2001  Monsma et al.
7,002,197 B2 * 2/2006  Perner et al. ................ 257/295

* cited by examiner

*Primary Examiner*—Mark V. Prenty
(74) *Attorney, Agent, or Firm*—Oblon, Spivak, McClelland, Maier & Neustadt, P.C.

(57) ABSTRACT

A resistance change memory includes a memory element, and a first organic semiconductor layer in contact with the memory element.

16 Claims, 26 Drawing Sheets

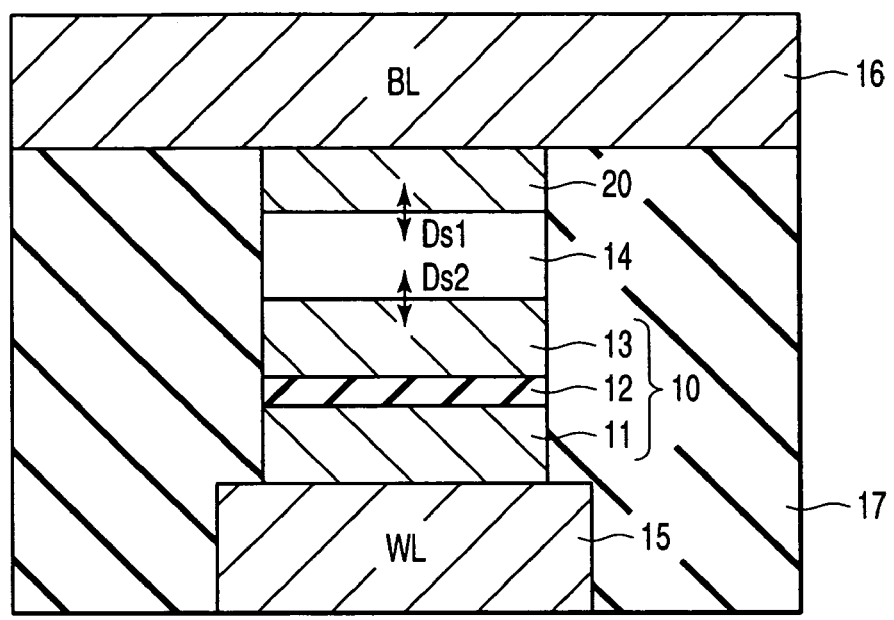
F I G. 21
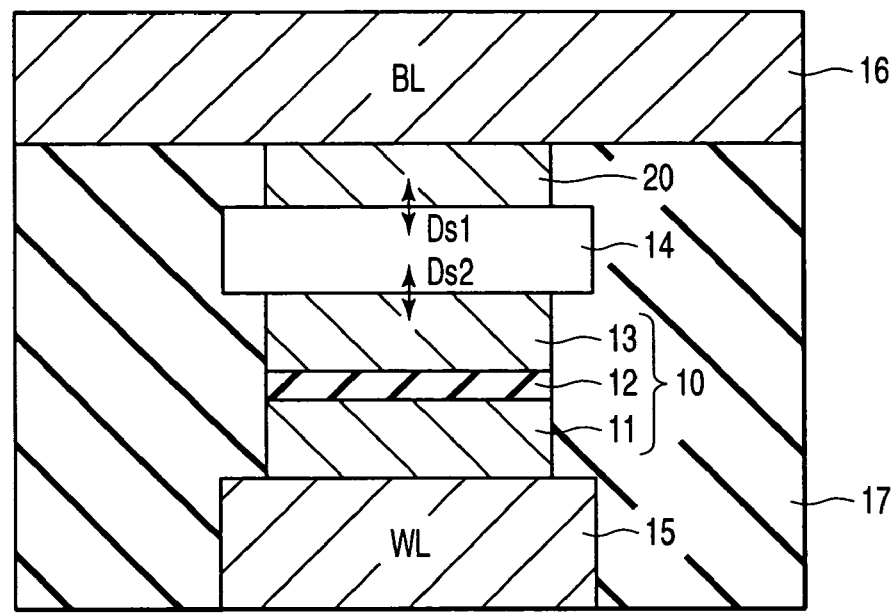
F I G. 22

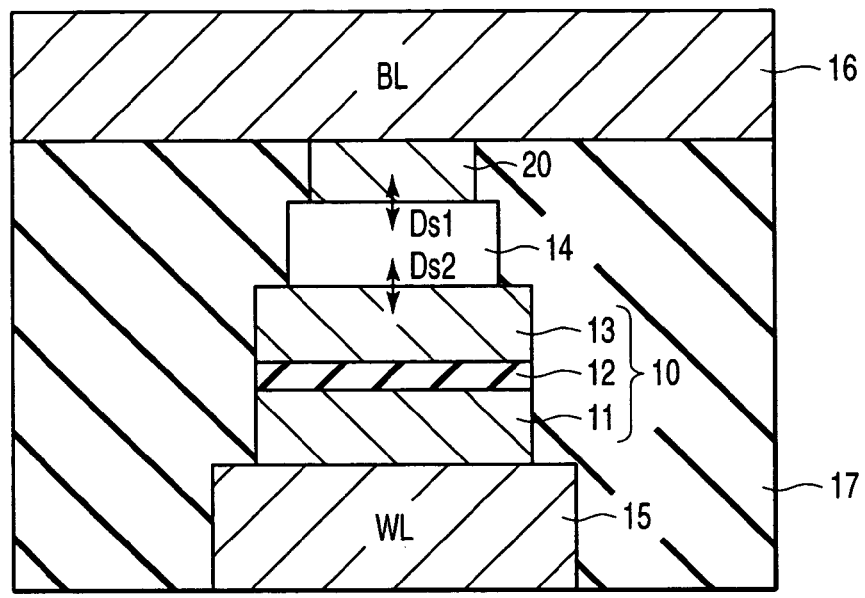
F I G. 2 3
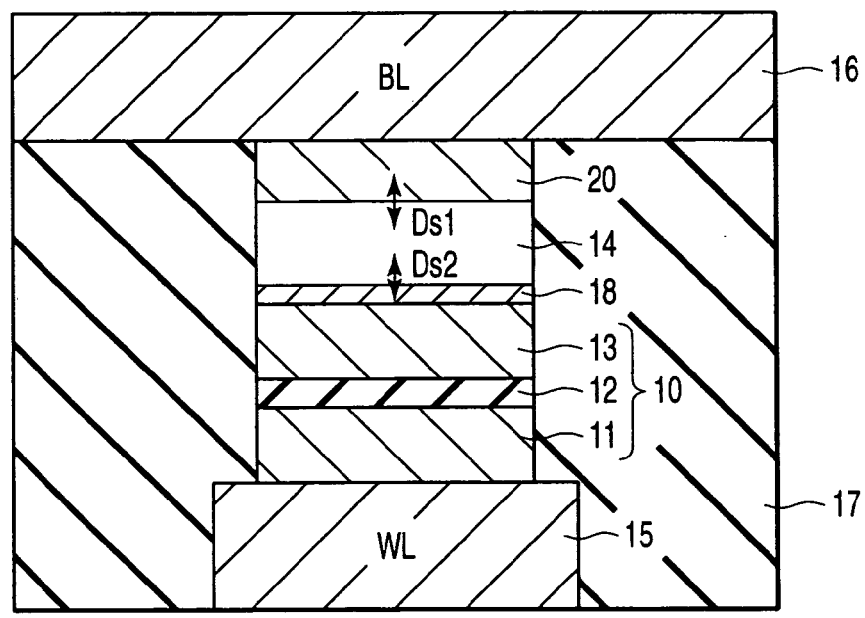
F I G. 2 4

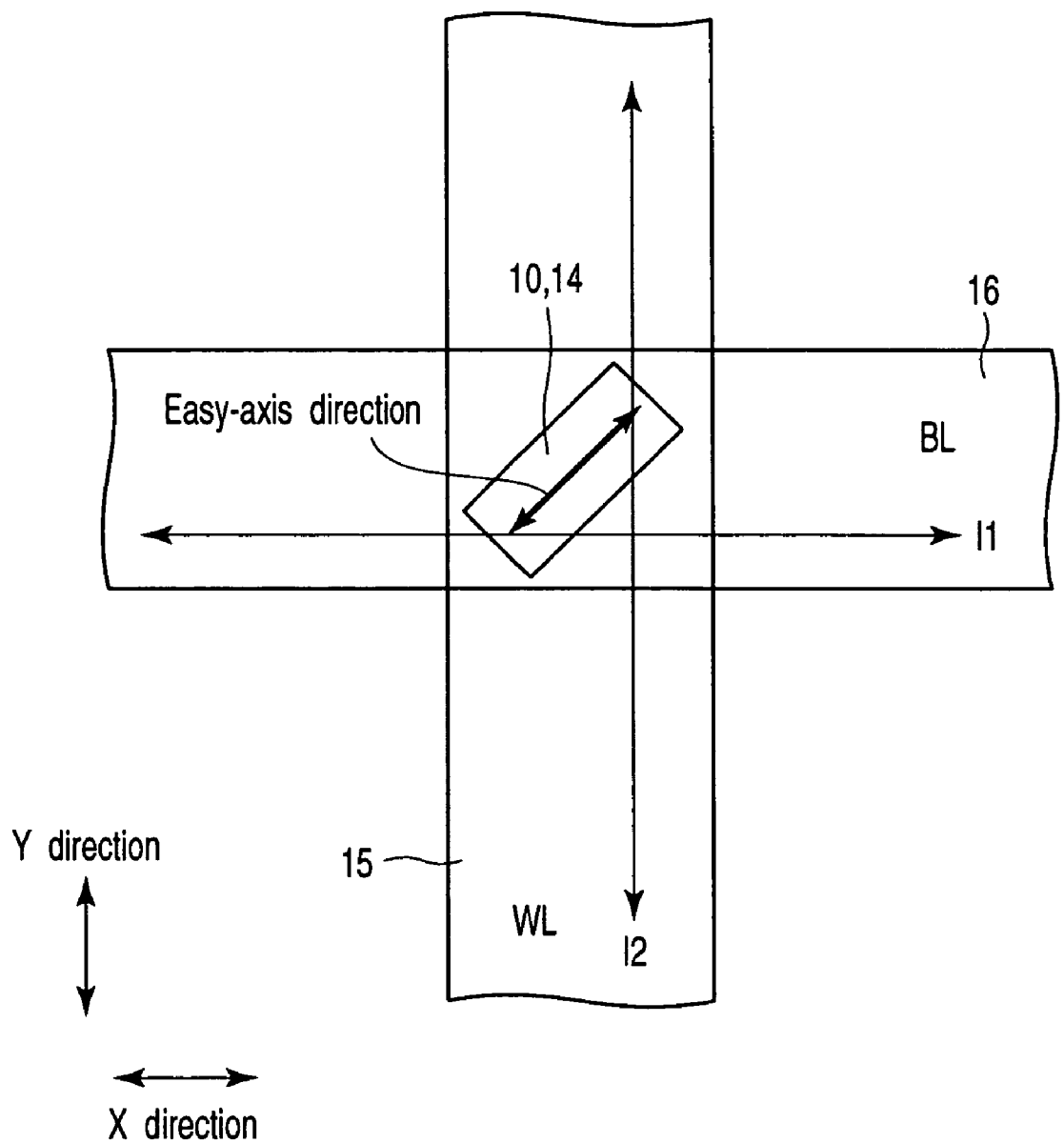
F I G. 37

→ Electric current of readout cell
--→ Sneak current

RESISTANCE CHANGE MEMORY HAVING ORGANIC SEMICONDUCTOR LAYER

CROSS-REFERENCE TO RELATED APPLICATIONS

This application is based upon and claims the benefit of priority from prior Japanese Patent Application No. 2003-381435, filed Nov. 11, 2003, the entire contents of which are incorporated herein by reference.

BACKGROUND OF THE INVENTION

1. Field of the Invention

The present invention relates to a resistance change memory having an organic semiconductor layer.

2. Description of the Related Art

Recently, an MRAM (Magnetic Random Access Memory) is attracting attention as a new semiconductor memory. Since this MRAM can be formed only by a metal with which relatively large readout signals can be obtained, memory cells can be formed only by arranging MTJ (Magnetic Tunnel Junction) elements at the cross points of interconnections. Accordingly, the capacity can be increased by, e.g., stacking cells. An MRAM having this structure is called a cross-point type MRAM.

FIG. 47 is a schematic perspective view of a cross-point type MRAM according to the prior art. As shown in FIG. 47, a cross-point type memory cell is basically made up of a bit line 16, a word line 15, and an MTJ element 10 sandwiched between the bit line 16 and word line 15. The MTJ element 10 includes a free layer 11, a fixed layer 13, and a tunnel insulating layer 12 sandwiched between the free layer 11 and fixed layer 13.

Unfortunately, the above conventional cross-point type MRAM poses the following problem when a memory cell array is formed.

As shown in FIG. 48, to read out data written in an MTJ element 10a of a selected cell, switches SW(j) and SW(i) are turned on to select a bit line BL(j) and word line WL(i). As a result, a read current flows through the MTJ element 10a of the selected cell along the direction of the solid-line arrow.

In the cross-point type structure, however, the selected bit line BL(j) and word line WL(i) are connected to a plurality of MTJ elements, in addition to the MTJ element 10a of the selected cell. Therefore, a sneak current flows through MTJ elements 10b, 10c, and 10d along the directions of the dotted-line arrows.

In the cross-point type MRAM as described above, the ratio of the sneak current which does not flow the shortest distance is larger than the read current which flows through the actually selected cell, and this causes read errors. In addition, this problem becomes significant as the scale of the memory cell array increases.

As shown in FIG. 48, an electric current flows through the MTJ element 10a upward on the paper, whereas an electric current flows through the MTJ element 10c downward on the paper. An amorphous silicon diode can be used to prevent this sneak current which flows in the direction opposite to the MTJ element 10a of the selected cell. However, the present MRAM materials cause interface diffusion and deteriorate the characteristics by annealing at about 300° C. Accordingly, these materials cannot resist the deposition temperatures of amorphous silicon and polysilicon.

BRIEF SUMMARY OF THE INVENTION

A resistance change element according to an aspect of the present invention comprises a memory element, and a first organic semiconductor layer in contact with the memory element.

BRIEF DESCRIPTION OF THE SEVERAL VIEWS OF THE DRAWING

FIG. 21 is a plan view showing a magnetic memory device having basic structure 4 according to the fourth embodiment of the present invention;

FIG. 22 is a plan view showing a magnetic memory device of Modification 4-1 according to the fourth embodiment of the present invention;

FIG. 23 is a plan view showing a magnetic memory device of Modification 4-2 according to the fourth embodiment of the present invention;

FIG. 24 is a plan view showing a magnetic memory device of Modification 4-3 according to the fourth embodiment of the present invention;

FIG. 37 is a plan view showing a toggle type magnetic memory device according to the ninth embodiment of the present invention;

DETAILED DESCRIPTION OF THE INVENTION

Figure 1:
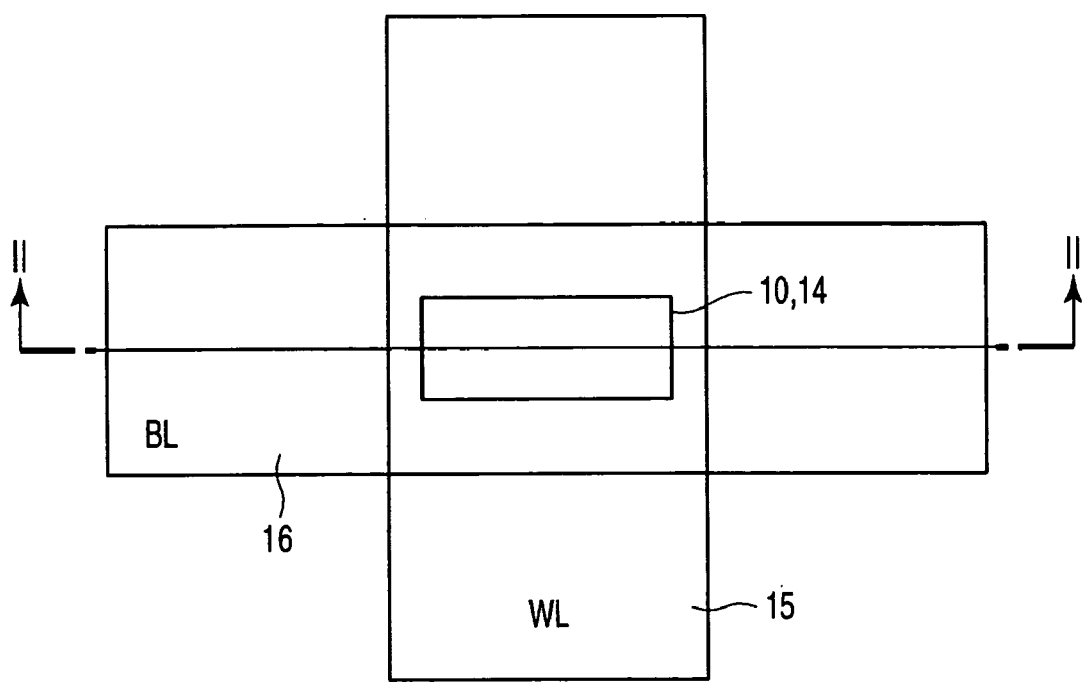
FIG. 1 is a plan view showing a magnetic memory device having basic structure 1 according to the first embodiment of the present invention.

In a magnetic memory device according to each embodiment of the present invention, a diode including an organic semiconductor layer is formed at least above or below a magnetoresistive effect element, e.g., an MTJ (Magnetic Tunnel Junction) element.

Embodiments of the present invention will be described below with reference to the accompanying drawing. In the following explanation, the same reference numerals denote the same parts throughout the drawing.

[1] First Embodiment

In the first embodiment, a p-n junction diode made of an organic semiconductor layer is formed below an MTJ element in a cross-point type MRAM (Magnetic Random Access Memory).

(Basic Structure 1)

Figure 2:
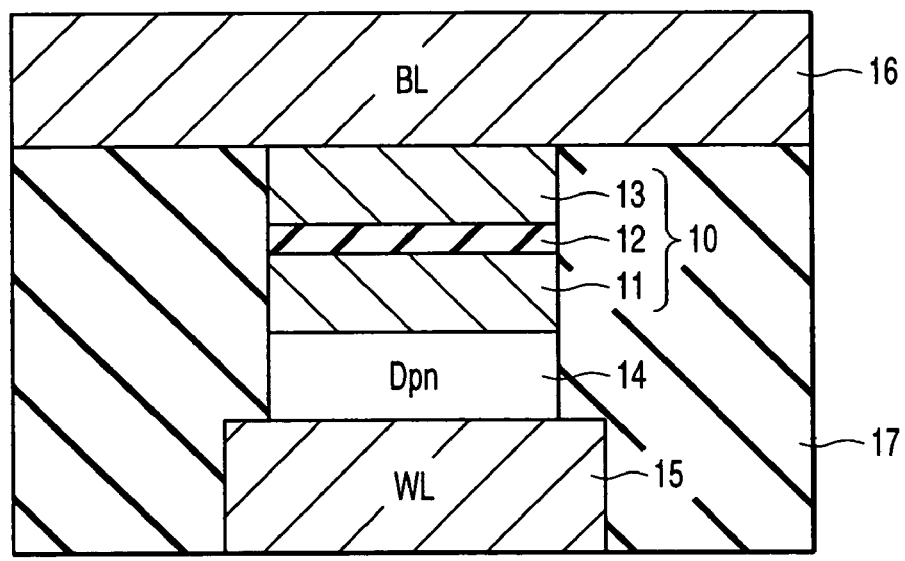
FIG. 2 is a sectional view of the magnetic memory device taken along a line II—II in FIG. 1.

FIGS. 1 and 2 illustrate a magnetic memory device having basic structure 1 according to the first embodiment of the present invention. As shown in FIGS. 1 and 2, an MTJ element 10 is formed at the intersection of a bit line (BL) 16 and word line (WL) 15, and an organic semiconductor layer 14 is formed between the MTJ element 10 and word line 15. The organic semiconductor layer 14 is a p-n junction diode Dpn including n-and p-type layers. For example, when a read current flows downward in FIG. 2 (in the direction from the bit line 16 to the word line 15), the p-n junction diode Dpn functions as a forward diode for an electric current which flows downward in FIG. 2, and as a reverse diode for an electric current which flows upward in FIG. 2.

The n-and p-type layers can be formed by using, e.g., pentacene as the material of the organic semiconductor layer 14. Also, a hole injection layer (p-type layer) of the organic semiconductor layer 14 is made of, e.g., CuPc, and an electron injection layer (n-type layer) of the organic semiconductor layer 14 is made of, e.g., PBD. The p-n junction diode Dpn can be formed by joining these hole and electron injection layers.

The organic semiconductor layer 14 is patterned using, e.g., the MTJ element 10 as a mask, and thereby given substantially the same planar shape as the MTJ element 10.

The MTJ element 10 has a fixed layer 11, a free layer 13, and a tunnel junction layer (e.g., an $AlO_3$ layer) 12 formed between the fixed layer 11 and free layer 13. The MTJ element 10 can have a single tunnel junction structure as shown in FIG. 2 in which the tunnel junction layer 12 is made of one layer, and can, of course, also have a double tunnel junction structure in which the tunnel junction layer 12 is made of two layers.

The easy axis of magnetization (the longitudinal direction) of the MTJ element 10 points in the direction in which the bit line 16 runs. The MTJ element 10 may also be rotated through 90° to point the hard axis of magnetization (the direction perpendicular to the longitudinal direction) of the MTJ element 10 in the direction in which the bit line 16 runs.

As the material of an insulating film 17 buried around the MTJ element 10 and organic semiconductor layer 14, it is desirable to use, e.g., an organic insulating film. Examples of this organic insulating film are organic SOG (e.g., MSG) and an organic polymer (e.g., a borazine-silicon polymer).

Basic structure 1 as described above is formed by, e.g., the following process. First, a word line 15 having a desired pattern is formed. An organic semiconductor layer 14 is formed on the word line 15, and an MTJ material layer as an MTJ element 10 is formed on the organic semiconductor layer 14. A resist is formed on the MTJ material layer, and processed into a desired pattern. The patterned resist is used as a mask to process the MTJ material layer, thereby forming an MTJ element 10 having a desired pattern. The MTJ element 10 is then used as a mask to process the organic semiconductor layer 14. After that, a bit line 16 having a desired pattern is formed.

In the above process, it is possible to form an MTJ material layer after the organic semiconductor layer 14 is patterned using the resist, and form an MTJ element 10 by processing this MTJ material layer.

Also, in the above process, the organic semiconductor layer 14 may also be patterned by using a hard mask and resist. In this case, a resist having a desired pattern is formed on the hard mask and used as a mask to process the hard mask, and this hard mask is used to process the organic semiconductor layer 14.

In addition, in the above process, the MTJ material layer may be patterned by using a hard mask and resist. In this case, a resist having a desired pattern is formed on the hard mask and used as a mask to process the hard mask, and this hard mask is used to process the MTJ material layer. After that, the hard mask may also be used, without being peeled off, as a mask to process the organic semiconductor layer 14.

In basic structure 1 of the first embodiment described above, the p-n junction diode Dpn made of the organic semiconductor layer 14 is formed below the MTJ element 10. Accordingly, in non-selected MTJ elements other than a selected MTJ element, the rectification characteristics of the p-n junction diode Dpn cut off the path of a sneak current which flows in the direction opposite to a read current which flows into the selected MTJ element. Since the sneak current during a read operation can be suppressed, therefore, a resistance signal change of the selected MTJ element alone can be monitored, and this prevents read errors.

Also, the material of the MTJ element in the MRAM deteriorates the characteristics by interdiffusion at high temperatures. So, the diode stacked on the MTJ element must be formed at low temperatures. Generally, organic semiconductor materials can be formed by coating at room temperature and annealing at about 100° C. Therefore, the organic semiconductor layer 14 can be formed at low temperatures compared to the TFT structure of amorphous silicon or polysilicon. Consequently, in the present MRAM in which the characteristics may deteriorate by interface diffusion by annealing at about 300° C., the p-n junction diode Dpn and MTJ element 10 can be stacked without deteriorating the characteristics of the MTJ element 10.

The organic semiconductor layer 14 is positioned below the MTJ element 10. In this structure, it is possible to peel off the resist as a mask of the MTJ element 10 during the processing of the MTJ element 10, and process the organic semiconductor layer 14 by using the processed portion of the MTJ element 10 as a mask. This is very advantageous because shaving of the organic semiconductor layer 14 can be prevented when the resist is peeled off.

Furthermore, since the insulating film 17 around the MTJ element 10 and organic semiconductor layer 14 is an organic insulating film, this organic insulating film can be formed through substantially the same steps as the processing of the organic semiconductor layer 14. Therefore, if one of these processes is an organic semiconductor process, matching using this process can be easily obtained.

(Modification 1-1)

Figure 3:
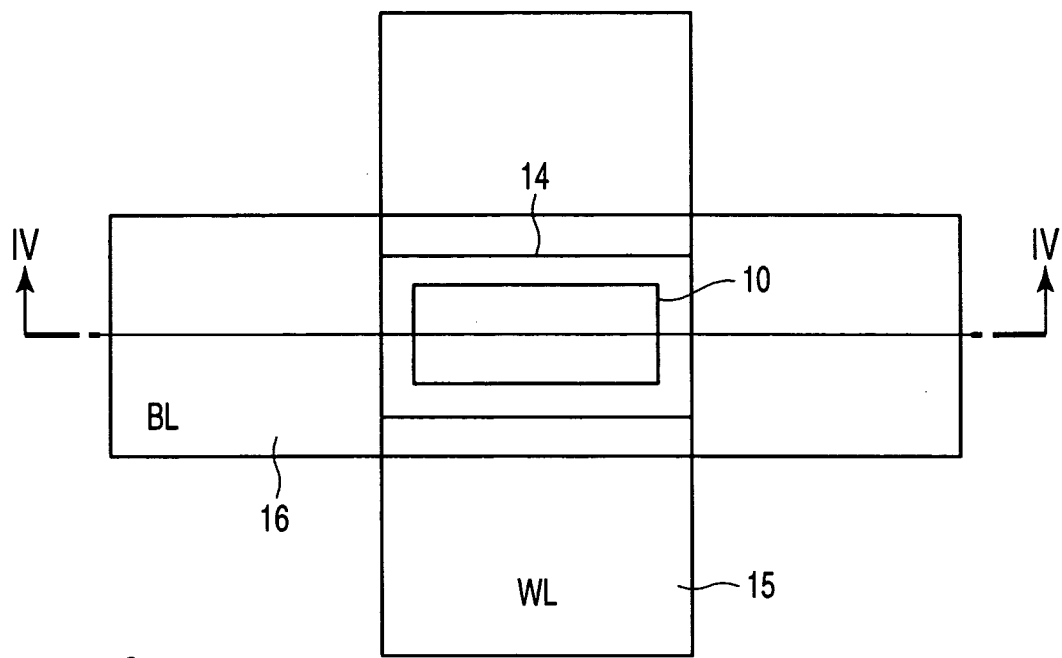
FIG. 3 is a plan view showing a magnetic memory device of Modification 1-1 according to the first embodiment of the present invention.
Figure 4:
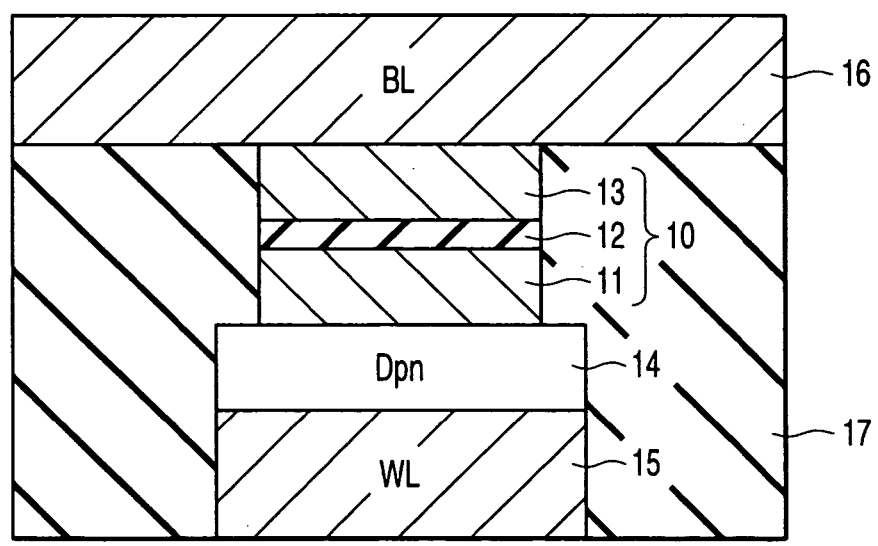
FIG. 4 is a sectional view of the magnetic memory device taken along a line IV—IV in FIG. 3.

FIGS. 3 and 4 illustrate a magnetic memory device of Modification 1-1 according to the first embodiment of the present invention. As shown in FIGS. 3 and 4, Modification 1-1 differs from basic structure 1 described above in that the planar shape of an organic semiconductor layer 14 is larger than that of an MTJ element 10. In this structure, the width of the organic semiconductor layer 14 in the direction in which a bit line 16 runs can be equal to the width of a word line 15, or the width of the organic semiconductor layer 14 in the direction in which the word line 15 runs can be equal to the width of the bit line 16.

In Modification 1-1 of the first embodiment, it is possible to obtain not only the same effects as in basic structure 1, but also the following effects because the planar shape of the organic semiconductor layer 14 is larger than that of the MTJ element 10.

That is, it is possible to reliably bring the organic semiconductor layer 14 and MTJ element 10 into contact with each other, and reduce the contact resistance. Furthermore, when the MTJ element 10 is patterned, the organic semiconductor layer 14 can function as an etching stopper.

(Modification 1-2)

Figure 5:
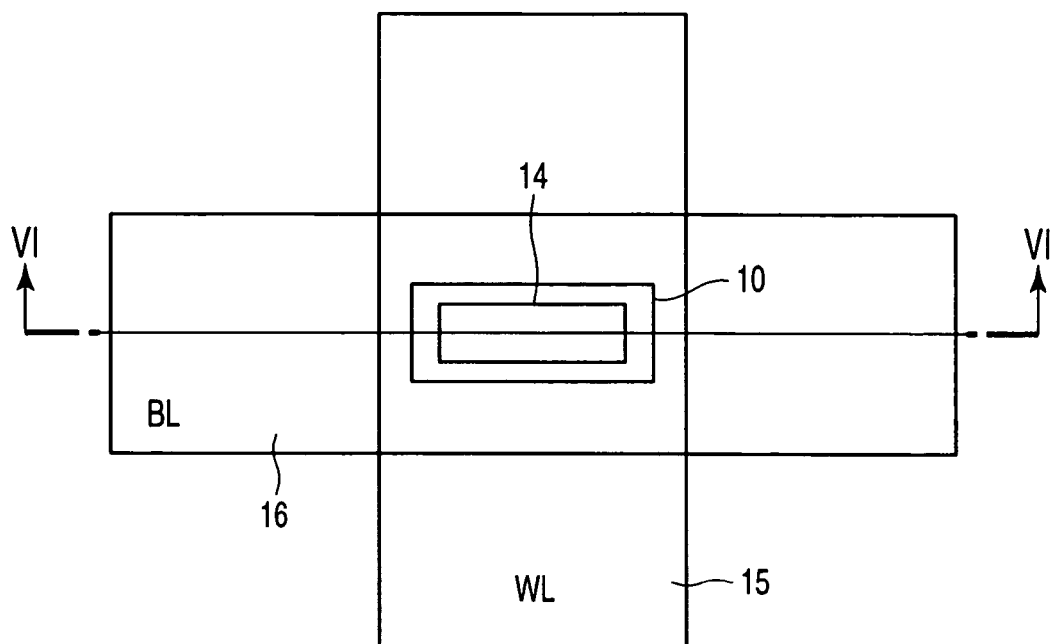
FIG. 5 is a plan view showing a magnetic memory device of Modification 1-2 according to the first embodiment of the present invention.
Figure 6:
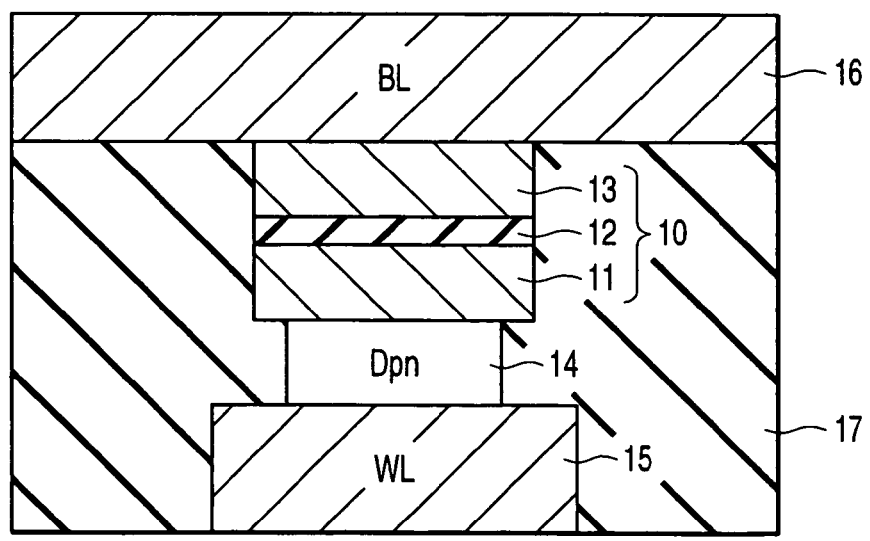
FIG. 6 is a sectional view of the magnetic memory device taken along a line VI—VI in FIG. 5.

FIGS. 5 and 6 illustrate a magnetic memory device of Modification 1-2 according to the first embodiment of the present invention. As shown in FIGS. 5 and 6, Modification 1-2 differs from basic structure 1 described above in that the planar shape of an organic semiconductor layer 14 is smaller than that of an MTJ element 10.

In Modification 1-2 of the first embodiment, it is possible to obtain not only the same effects as in basic structure 1, but also the following effects because the planar shape of the organic semiconductor layer 14 is smaller than that of the MTJ element 10.

That is, when the MTJ element 10 is patterned, etching damage to be the organic semiconductor layer 14 can be prevented because the organic semiconductor layer 14 does not exist below the edges of the MTJ element 10. Also, even if the organic semiconductor layer 14 is made smaller than the desired size by the processing, an increase in contact resistance between the organic semiconductor layer 14 and MTJ element 10 can be suppressed by making the MTJ element 10 larger than the organic semiconductor layer 14.

(Modification 1-3)

Figure 7:
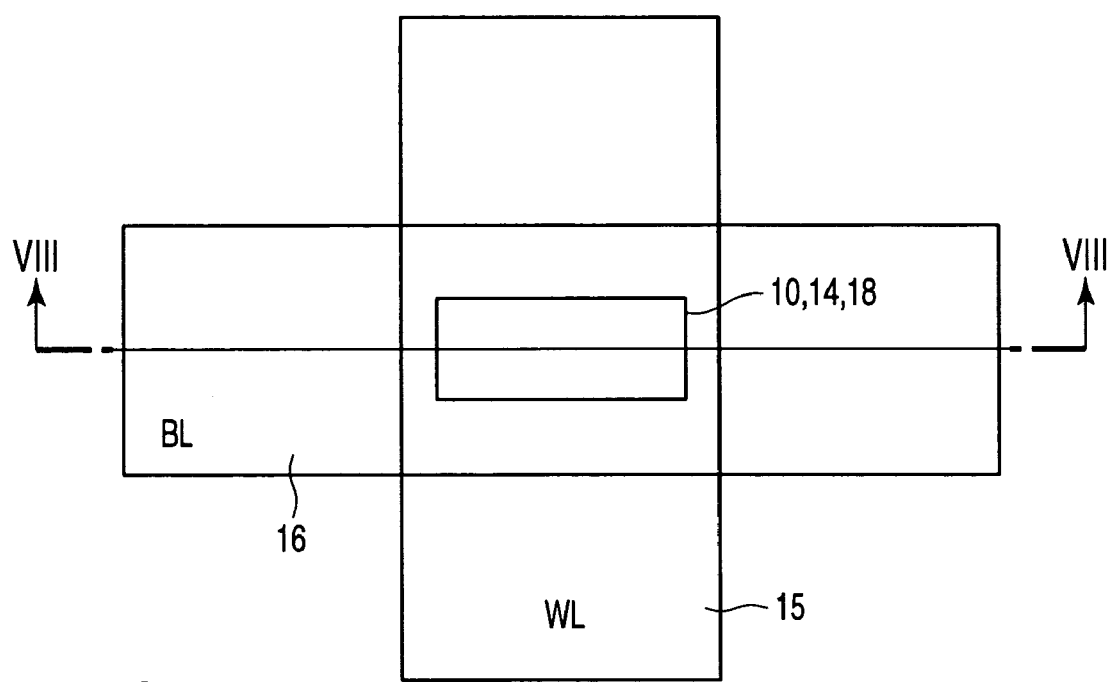
FIG. 7 is a plan view showing a magnetic memory device of Modification 1-3 according to the first embodiment of the present invention.
Figure 8:
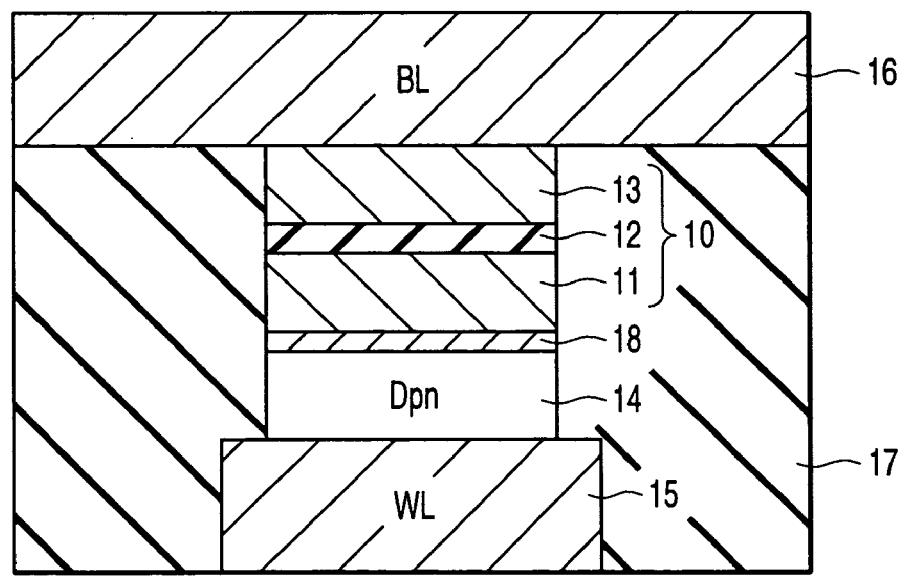
FIG. 8 is a sectional view of the magnetic memory device taken along a line VIII—VIII in FIG. 7.

FIGS. 7 and 8 illustrate a magnetic memory device of Modification 1-3 according to the first embodiment of the present invention. As shown in FIGS. 7 and 8, Modification 1-3 differs from basic structure 1 described above in that a barrier metal film 18 is formed between an organic semiconductor layer 14 and MTJ element 10.

When the interface with the organic semiconductor material of the organic semiconductor layer 14 and the interface with the electrode material of a fixed layer 11 are taken into consideration, the material of the barrier metal film 18 is desirably, e.g., Ta, TaN, or TiN. Any of Ta, TaN, and TiN is highly likely to be used as part of the electrode material of the fixed layer 11, so the probability that any of these materials functions as the barrier metal film 18 is high.

In Modification 1-3 of the first embodiment, it is possible to obtain not only the same effects as in basic structure 1, but also the following effects because the barrier metal film 18 is formed.

That is, even if some reaction occurs in the interface between the MTJ element 10 and organic semiconductor layer 14 or gases are produced from these materials, the reaction or gases can be suppressed by the barrier metal film 18. Also, the barrier metal film 18 can be used as a stopper when the MTJ element 10 is processed.

In this modification, the barrier metal film 18 is applied to basic structure 1 described above. However, the barrier metal film 18 may also be formed between the organic semiconductor layer 14 and MTJ element 10 in Modification 1-1 or 1-2. In this case, the barrier metal film 18 can have the same pattern as the MTJ element 10 or as the organic semiconductor layer 14, and can also have a pattern different from those of the MTJ element 10 and organic semiconductor layer 14.

[2] Second Embodiment

In the second embodiment, a p-n junction diode made of an organic semiconductor layer is formed above an MTJ element in a cross-point type MRAM.

(Basic Structure 2)

Figure 9:
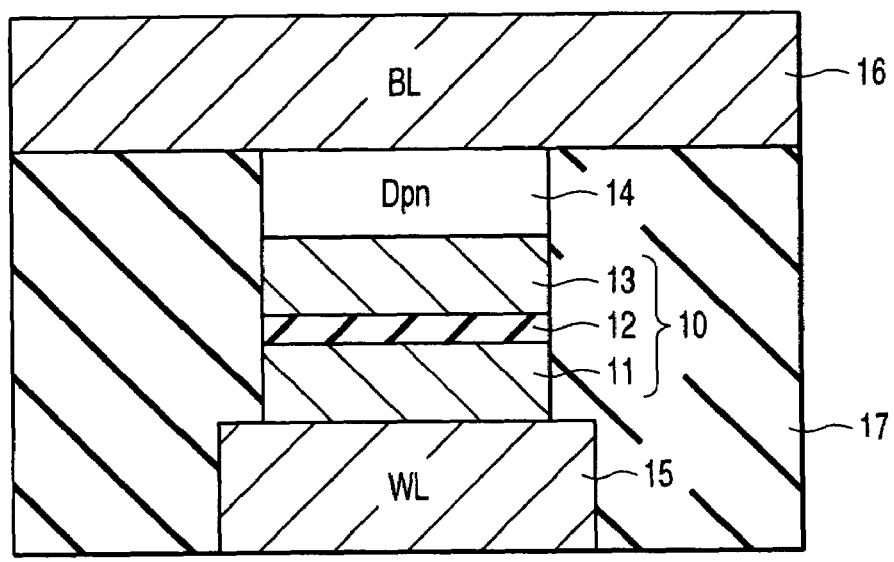
FIG. 9 is a plan view showing a magnetic memory device having basic structure 2 according to the second embodiment of the present invention.

FIG. 9 is a sectional view of a magnetic memory device having basic structure 2 according to the second embodiment of the present invention. As shown in FIG. 9, basic structure 2 differs from basic structure 1 in that a p-n junction diode Dpn made of an organic semiconductor layer 14 is formed between an MTJ element 10 and bit line 16. That is, the organic semiconductor layer 14 is formed on the MTJ element 10.

Basic structure 2 of the second embodiment achieves the same effect of suppressing a sneak current as in basic structure 1. In addition, unlike in basic structure 1, basic structure 2 achieves the following effect because the organic semiconductor layer 14 is formed above the MTJ element 10.

In the MRAM, a large electric current must be supplied to upper and lower crossed write lines (the bit line 16 and a word line 15) sandwiching the MTJ element 10, so Cu lines formed by the damascene process are highly likely to be used as these write lines. Also, Cu lines and a low-dielectric interlayer dielectric film are often used on the logic side, and an organic insulating film is a strong candidate for the low-dielectric interlayer dielectric film.

If in basic structure 1 shown in FIG. 2 a Cu line formed by the damascene process is used as the lower line (word line 15) and an organic insulating film is used as an interlayer dielectric film 17, the organic insulating film 17 around the Cu line may also be etched at the same time the organic semiconductor layer 14 is etched, since the organic semiconductor layer 14 is formed below the MTJ element 10. However, in basic structure 2 shown in FIG. 9, this cannot happen because the organic semiconductor layer 14 is formed above the MTJ element 10.

(Modification 2-1)

Figure 10:
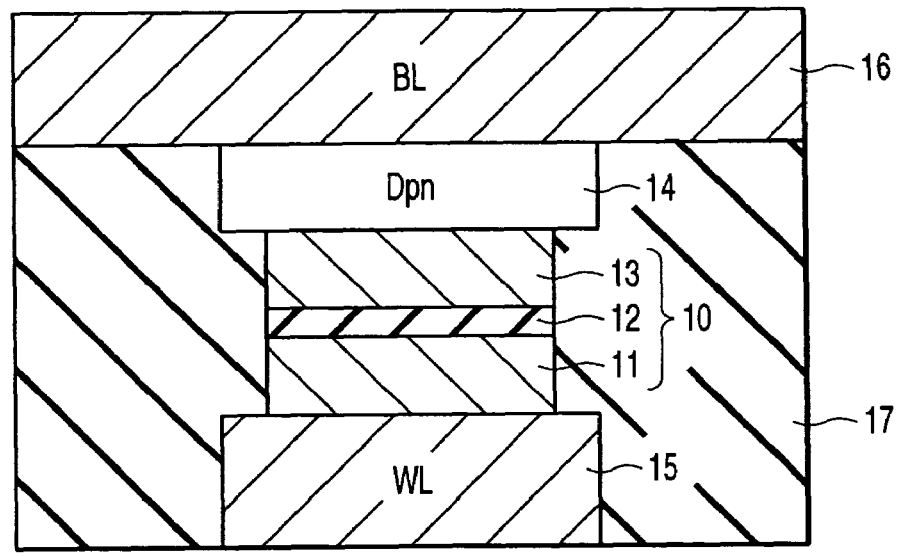
FIG. 10 is a plan view showing a magnetic memory device of Modification 2-1 according to the second embodiment of the present invention.

FIG. 10 shows a magnetic memory device of Modification 2-1 according to the second embodiment of the present invention. As shown in FIG. 10, Modification 2-1 differs from basic structure 2 described above in that the planar shape of an organic semiconductor layer 14 is larger than that of an MTJ element 10.

In Modification 2-1 of the second embodiment, it is possible to obtain not only the same effects as in basic structure 2, but also the following effects because the planar shape of the organic semiconductor layer 14 is larger than that of the MTJ element 10.

That is, it is possible to reliably bring the organic semiconductor layer 14 and MTJ element 10 into contact with each other, and reduce the contact resistance. Also, when the organic semiconductor layer 14 is patterned, etching damage to be the MTJ element 10 can be prevented because the MTJ element 10 does not exist below the edges of the organic semiconductor layer 14.

(Modification 2-2)

Figure 11:
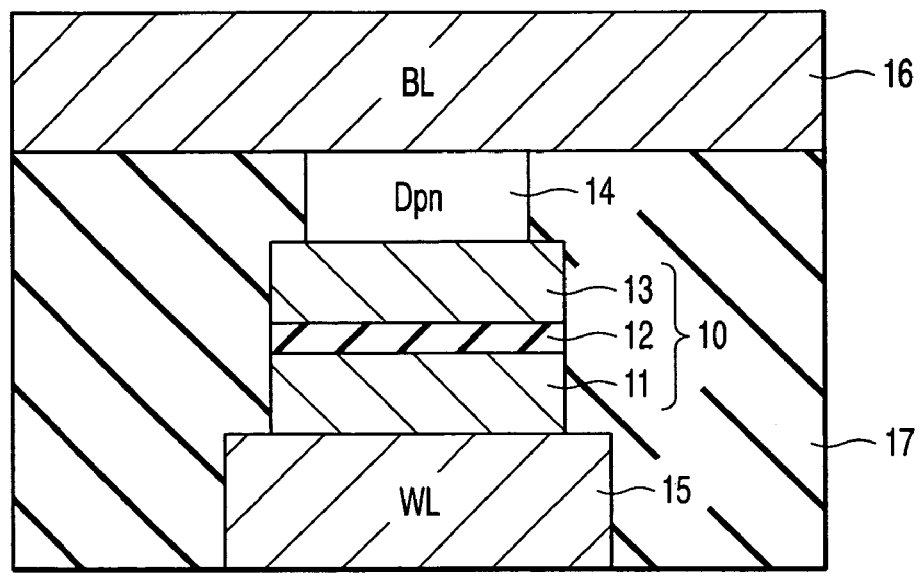
FIG. 11 is a plan view showing a magnetic memory device of Modification 2-2 according to the second embodiment of the present invention.

FIG. 11 shows a magnetic memory device of Modification 2-2 according to the second embodiment of the present invention. As shown in FIG. 11, Modification 2-2 differs from basic structure 2 described above in that the planar shape of an organic semiconductor layer 14 is smaller than that of an MTJ element 10.

In Modification 2-2 of the second embodiment, it is possible to obtain not only the same effects as in basic structure 2, but also the following effects because the planar shape of the organic semiconductor layer 14 is smaller than that of the MTJ element 10.

That is, when the organic semiconductor layer 14 is patterned, the MTJ element 10 can function as an etching stopper. Also, even if the organic semiconductor layer 14 is made smaller than the desired size by the processing, an increase in contact resistance between the organic semiconductor layer 14 and MTJ element 10 can be suppressed by making the MTJ element 10 larger than the organic semiconductor layer 14.

(Modification 2-3)

Figure 12:
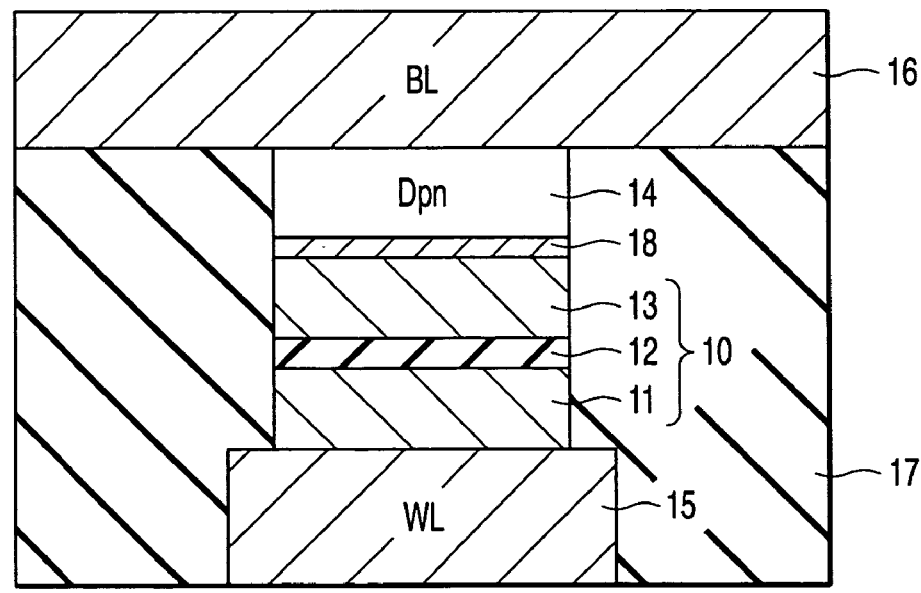
FIG. 12 is a plan view showing a magnetic memory device of Modification 2-3 according to the second embodiment of the present invention.

FIG. 12 shows a magnetic memory device of Modification 2-3 according to the second embodiment of the present invention. As shown in FIG. 12, Modification 2-3 differs from basic structure 2 described above in that a barrier metal film 18 is formed between an organic semiconductor layer 14 and MTJ element 10. The material of the barrier metal film 18 is can be the same as in Modification 1-3 described earlier.

In Modification 2-3 of the second embodiment, it is possible to obtain not only the same effects as in basic structure 2, but also the same unique effects as in Modification 1-3.

Note that in this modification, the barrier metal film 18 is applied to basic structure 2 described above. However, the barrier metal film 18 may also be formed between the organic semiconductor layer 14 and MTJ element 10 in Modification 2-1 or 2-2. In this case, the barrier metal film 18 can have the same pattern as the MTJ element 10 or the organic semiconductor layer 14, and can also have a pattern different from those of the MTJ element 10 and organic semiconductor layer 14.

[3] Third Embodiment

In the third embodiment, Schottky junction diodes including an organic semiconductor layer are formed below an MTJ element in a cross-point type MRAM.

(Basic Structure 3)

Figure 13:
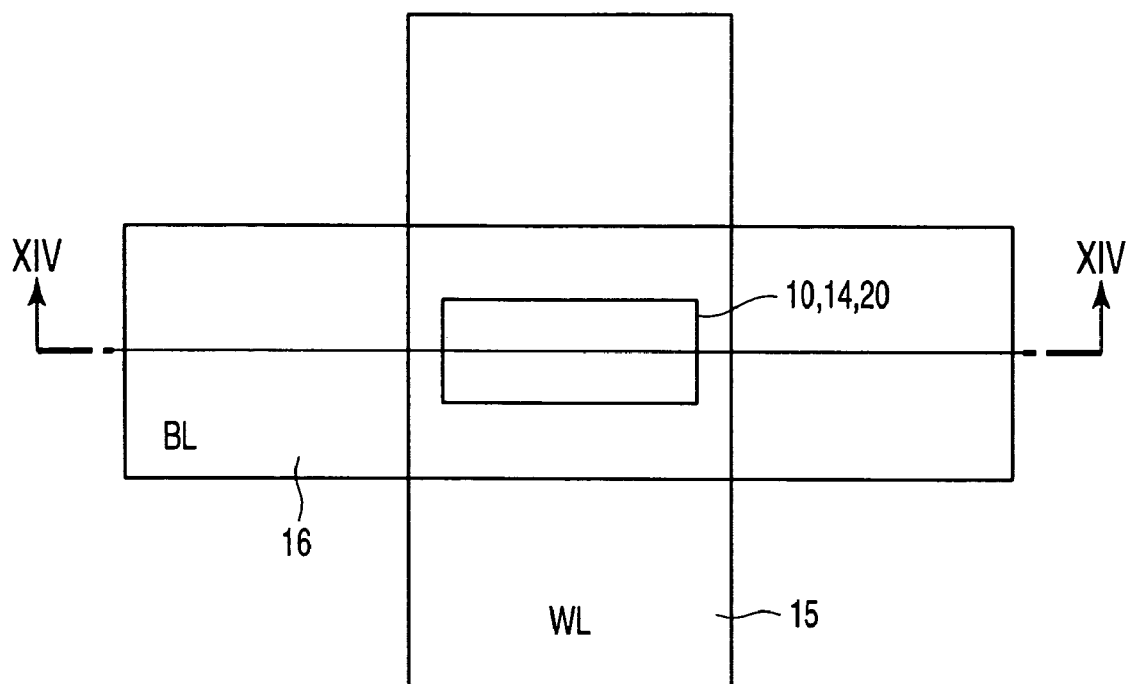
FIG. 13 is a plan view showing a magnetic memory device having basic structure 3 according to the third embodiment of the present invention.
Figure 14:
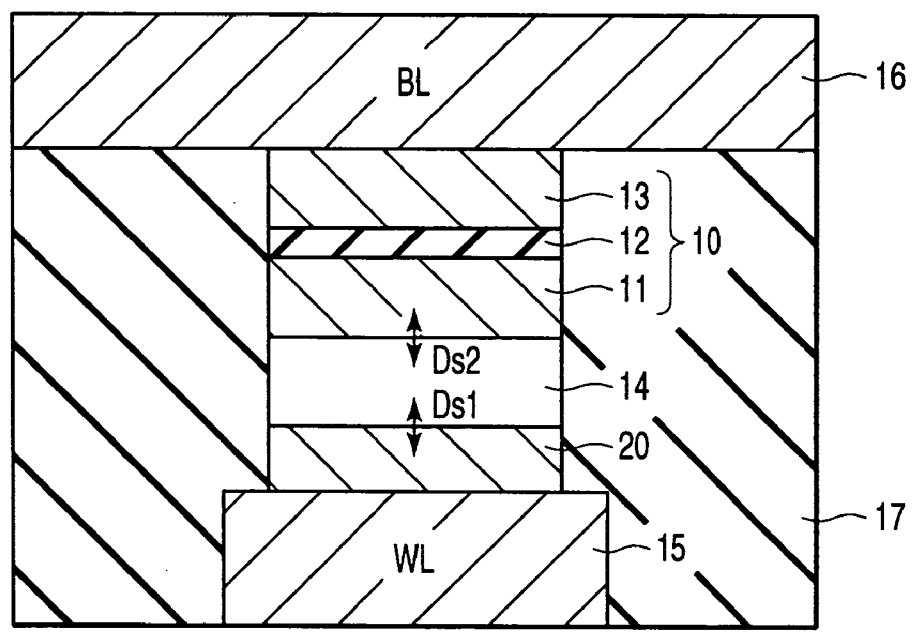
FIG. 14 is a sectional view of the magnetic memory device taken along a line XIV—XIV in FIG. 13.

FIGS. 13 and 14 illustrate a magnetic memory device having basic structure 3 according to the third embodiment of the present invention. As shown in FIGS. 13 and 14, an MTJ element 10 is formed at the intersection between a bit line 16 and word line 15, and an organic semiconductor layer 14 and metal layer 20 are formed between the MTJ element 10 and word line 15. The upper and lower surfaces of the organic semiconductor layer 14 are in contact with a fixed layer 11 and the metal layer 20, respectively.

The organic semiconductor layer 14 is made of one n-or p-type material without forming any p-n junction. The organic semiconductor layer 14 and metal layer 20 form a Schottky junction diode Ds1, and the organic semiconductor layer 14 and fixed layer 11 form a Schottky junction diode Ds2. In the Schottky junction diodes Ds1 and Ds2, the direction in which a read current flows is set as a forward direction by adjusting the impurity concentration in the organic semiconductor layer 14 forming the Schottky barrier, or by selecting the metal materials of the metal layer 20 and fixed layer 11.

In the Schottky junction diodes Ds1 and Ds2 obtained by joining the metal and semiconductor as described above, a difference between an electric current formed by carriers which flow from the metal to the semiconductor and an electric current formed by carriers which flow from the semiconductor to the metal is an electric current which flows through the Schottky junction. When a bias is applied to the Schottky junction, the potential barrier on the semiconductor side changes while the barrier on the metal side remains unchanged, so the value of the electric current which flows from the semiconductor to the metal changes. When a forward bias is applied, therefore, the potential barrier on the semiconductor side decreases, and this increases the electric current which flows from the semiconductor to the metal. On the other hand, when a reverse bias is applied, the potential barrier on the semiconductor side increases, so the electric current from the semiconductor side reduces. By using these characteristics of the Schottky junction, the applied bias to the Schottky junction is adjusted so that the direction in which the read current flows is the forward direction.

The organic semiconductor layer 14 and metal layer 20 are patterned using, e.g., the MTJ element 10 as a mask, and thereby given substantially the same planar shape as the MTJ element 10.

In basic structure 3 of the third embodiment described above, the Schottky junction diodes Ds1 and Ds2 are formed by forming the organic semiconductor layer 14 and metal layer 20 below the MTJ element 10. Accordingly, in non-selected MTJ elements other than a selected MTJ element, the rectification characteristics of the Schottky junction diodes Ds1 and Ds2 cut off the path of a sneak current which flows in the direction opposite to a read current which flows into the selected MTJ element. Since the sneak current during a read operation can be suppressed, therefore, a resistance signal change of the selected MTJ element alone can be monitored, and this prevents read errors.

Also, since the characteristics of the Schottky junction are determined by selection of the two materials, i.e., the metal and semiconductor, the selectivity of the materials forming the Schottky junction improves. In addition, the same effects as in basic structure 1 of the first embodiment described earlier can be obtained.

Note that the metal layer 20 need not always be formed. That is, a Schottky barrier may also be formed by the interface between the word line 15 and organic semiconductor layer 14.

(Modification 3-1)

Figure 15:
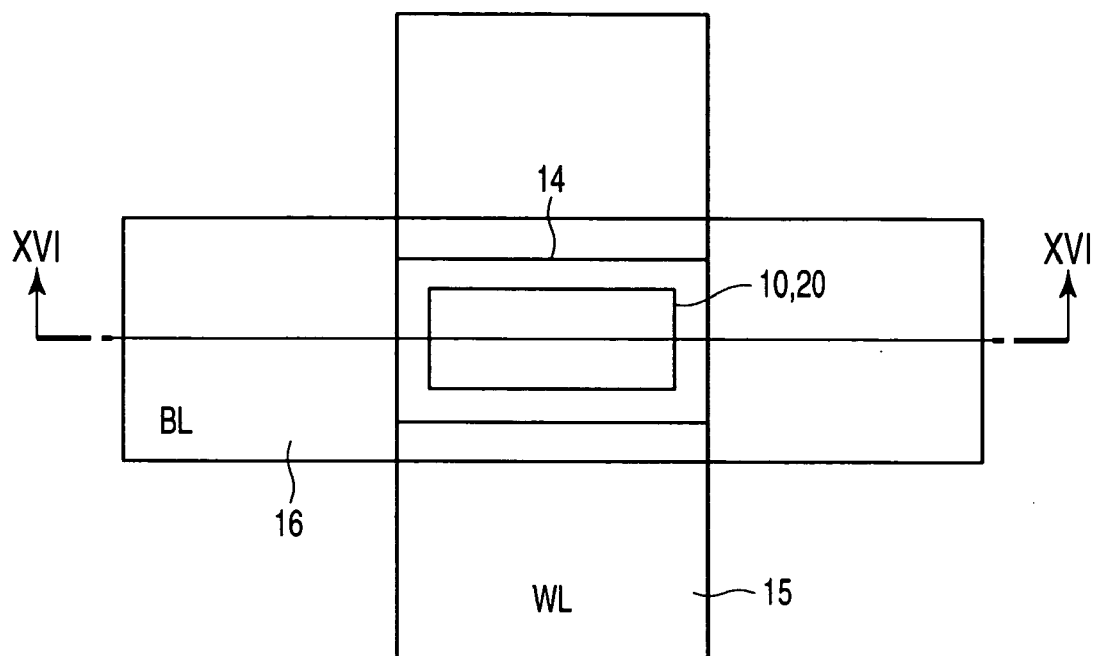
FIG. 15 is a plan view showing a magnetic memory device of Modification 3-1 according to the third embodiment of the present invention.
Figure 16:
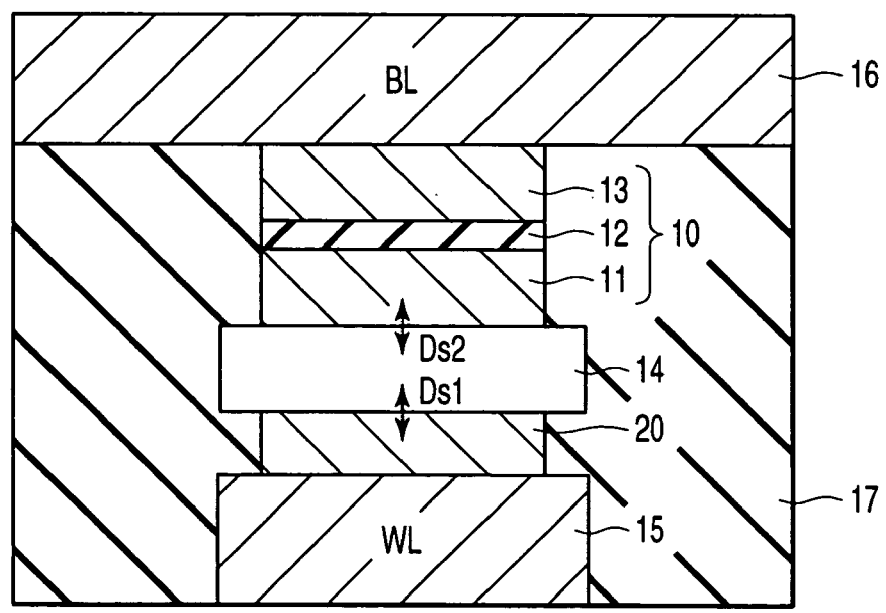
FIG. 16 is a sectional view of the magnetic memory device taken along a line XVI—XVI in FIG. 15.

FIGS. 15 and 16 illustrate a magnetic memory device of Modification 3-1 according to the third embodiment of the present invention. As shown in FIGS. 15 and 16, Modification 3-1 differs from basic structure 3 described above in that the planar shape of an organic semiconductor layer 14 is larger than that of an MTJ element 10. In this structure, the width of the organic semiconductor layer 14 in the direction in which a bit line 16 runs can be equal to the width of a word line 15, or the width of the organic semiconductor layer 14 in the direction in which the word line 15 runs can be equal to the width of the bit line 16.

Also, a metal layer 20 can have the same pattern as the MTJ element 10 or as the organic semiconductor layer 14, and can also have a pattern different from those of the MTJ element 10 and organic semiconductor layer 14.

In Modification 1-3 of the third embodiment, it is possible to obtain not only the same effects as in basic structure 3, but also the same unique effects as in Modification 1-1 described previously.

(Modification 3-2)

Figure 17:
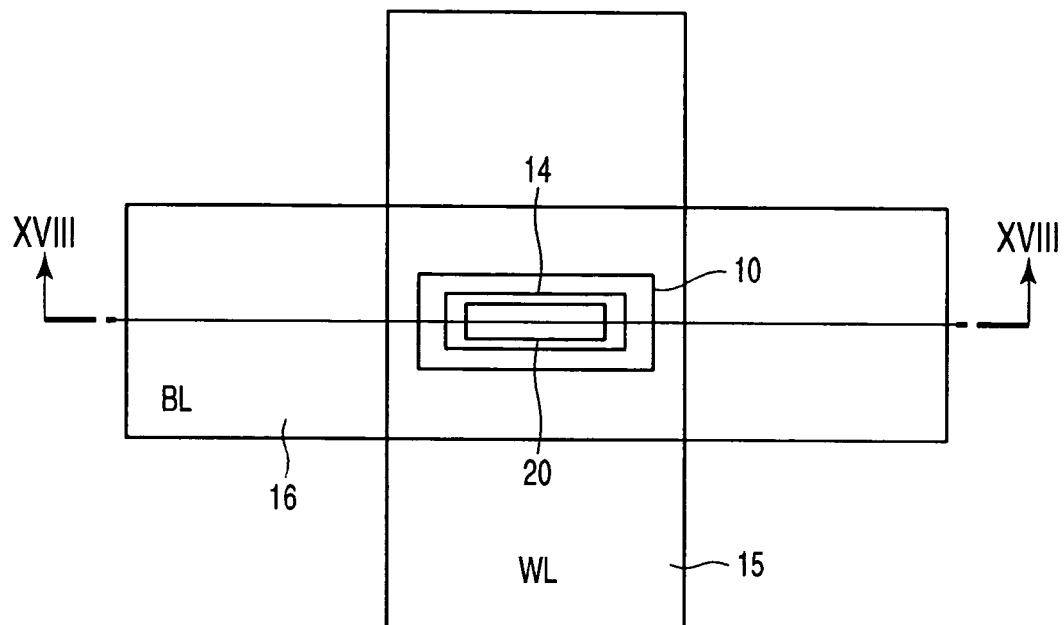
FIG. 17 is a plan view showing a magnetic memory device of Modification 3-2 according to the third embodiment of the present invention.
Figure 18:
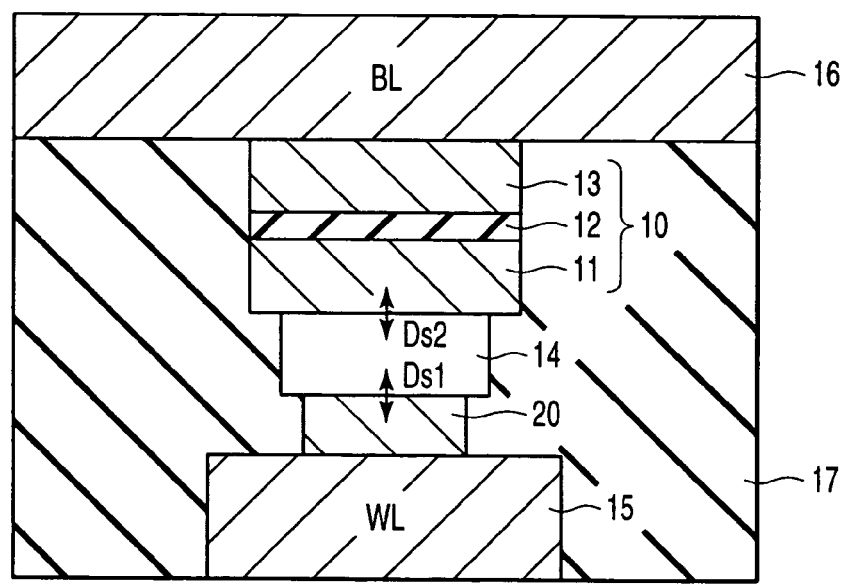
FIG. 18 is a sectional view of the magnetic memory device taken along a line XVIII—XVIII in FIG. 17.

FIGS. 17 and 18 illustrate a magnetic memory device of Modification 3-2 according to the third embodiment of the present invention. As shown in FIGS. 17 and 18, Modification 3-2 differs from basic structure 3 described above in that the planar shape of an organic semiconductor layer 14 is smaller than that of an MTJ element 10, and the planar shape of a metal layer 20 is smaller than that of the organic semiconductor layer 14.

In Modification 3-2 of the third embodiment, it is possible to obtain not only the same effects as in basic structure 3, but also the same unique effects as in Modification 1-2 described earlier.

Note that in the structure shown in FIG. 18, the planar shape of the metal layer 20 is smaller than that of the organic semiconductor layer 14. However, the metal layer 20 may also have the same planar shape as the organic semiconductor layer 14.

(Modification 3-3)

Figure 19:
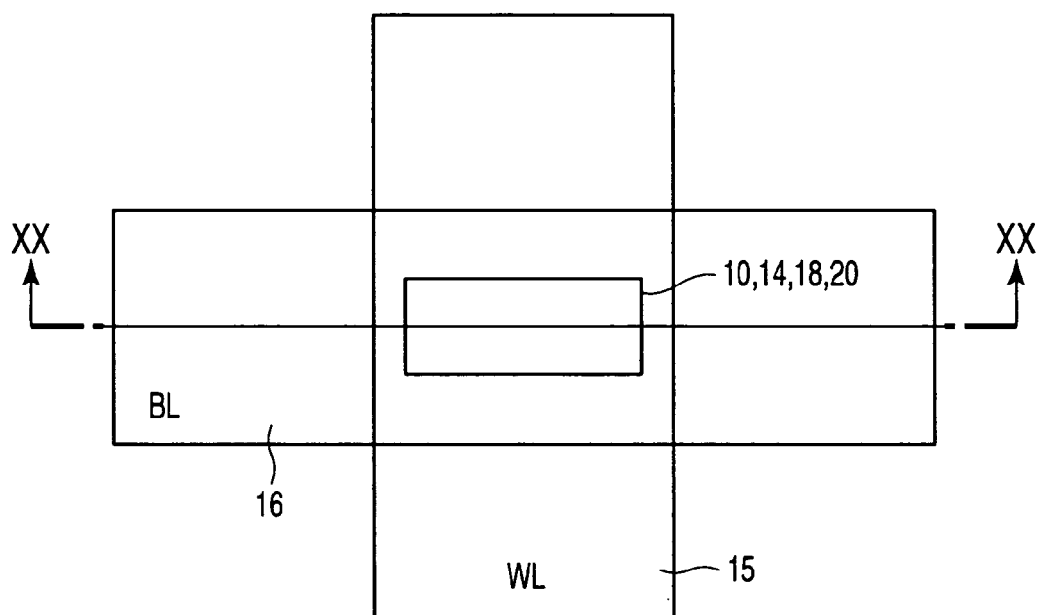
FIG. 19 is a plan view showing a magnetic memory device of Modification 3-3 according to the third embodiment of the present invention.
Figure 20:
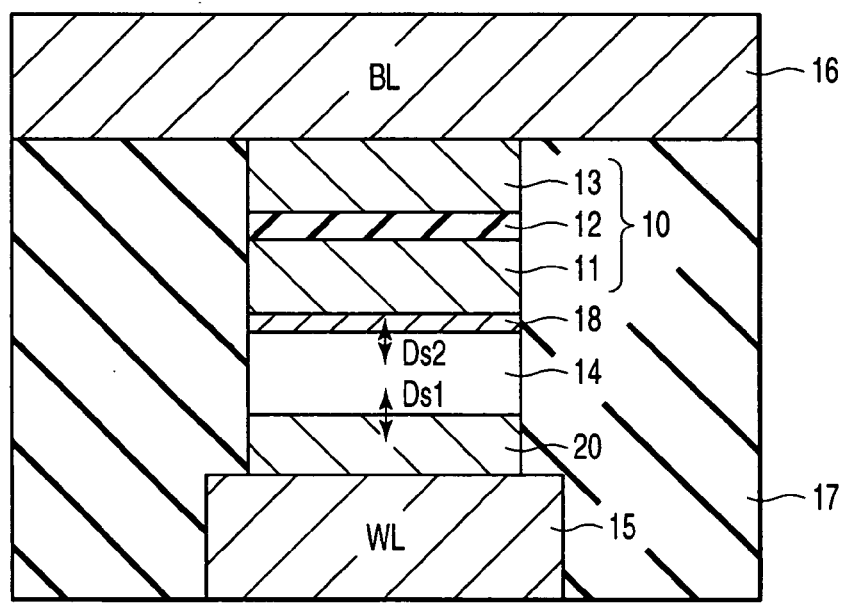
FIG. 20 is a sectional view of the magnetic memory device taken along a line XX—XX in FIG. 19.

FIGS. 19 and 20 illustrate a magnetic memory device of Modification 3-3 according to the third embodiment of the present invention. As shown in FIGS. 19 and 20, Modification 3-3 differs from basic structure 3 in that a barrier metal film 18 is formed between an organic semiconductor layer 14 and MTJ element 10. In this structure, a Schottky junction diode Ds1 is formed by the organic semiconductor layer 14 and a metal layer 20, and a Schottky junction diode Ds2 is formed by the organic semiconductor layer 14 and barrier metal film 18.

TiN, for example, forms a Schottky junction with a p-type Si semiconductor. Therefore, when the organic semiconductor layer 14 is made of a p-type Si semiconductor, TiN can be used as the material of the barrier metal film 18.

In Modification 3-3 of the third embodiment, it is possible to obtain not only the same effects as in basic structure 3, but also the same unique effects as in Modification 1-3 described previously.

Note that in this modification, the barrier metal film 18 is applied to basic structure 3 described above. However, the barrier metal film 18 may also be formed between the organic semiconductor layer 14 and MTJ element 10 in Modification 3-1 or 3-2. In this case, the barrier metal film 18 can have the same pattern as the MTJ element 10 or as the organic semiconductor layer 14, and can also have a pattern different from those of the MTJ element 10 and organic semiconductor layer 14.

[4] Fourth Embodiment

In the fourth embodiment, Schottky junction diodes including an organic semiconductor layer are formed above an MTJ element in a cross-point type MRAM.

(Basic Structure 4)

FIG. 21 shows a magnetic memory device having basic structure 4 according to the fourth embodiment of the present invention. As shown in FIG. 21, basic structure 4 differs from basic structure 3 in that an organic semiconductor layer 14 and metal layer 20 are formed between an MTJ element 10 and bit line 16, and the upper and lower surfaces of the organic semiconductor layer 14 are in contact with the metal layer 20 and a free layer 13, respectively. That is, the organic semiconductor layer 14 and metal layer 20 are formed above the MTJ element 10.

The organic semiconductor layer 14 is made of one n-or p-type material without forming any p-n junction. The organic semiconductor layer 14 and metal layer 20 form a Schottky junction diode Ds1, and the organic semiconductor layer 14 and free layer 13 form a Schottky junction diode Ds2. In the Schottky junction diodes Ds1 and Ds2, the direction in which a read current flows is set as the forward direction by adjusting the impurity concentration in the organic semiconductor layer 14 forming the Schottky barrier, or by selecting the metal materials of the metal layer 20 and free layer 13.

The organic semiconductor layer 14 and metal layer 20 have substantially the same planar shape as the MTJ element 10.

Basic structure 4 of the fourth embodiment described above achieves the same effect of suppressing a sneak current as in basic structure 3. Also, in basic structure 4, the organic semiconductor layer 14 and metal layer 20 are formed above the MTJ element 10. Therefore, similar to basic structure 2, basic structure 4 is advantageous in processability when an organic insulating film is used as an insulating film 17.

Note that a cap layer for a contact may also be formed between the organic semiconductor layer 14 and MTJ element 10 (free layer 13). In this case, the Schottky junction diode Ds2 is formed by this cap layer and the organic semiconductor layer 14.

(Modification 4-1)

FIG. 22 shows a magnetic memory device of Modification 4-1 according to the fourth embodiment of the present invention. As shown in FIG. 22, Modification 4-1 differs from basic structure 4 described above in that the planar shape of an organic semiconductor layer 14 is larger than that of an MTJ element 10.

In Modification 4-1 of the fourth embodiment, it is possible to obtain not only the same effects as in basic structure 4, but also the same unique effects as in Modification 21 described previously.

Note that in the structure shown in FIG. 22, the metal layer 20 has the same planar shape as the MTJ element 10. However, the metal layer 20 may also have the same planar shape as the organic semiconductor layer 14.

(Modification 4-2)

FIG. 23 shows a magnetic memory device of Modification 4-2 according to the fourth embodiment of the present invention. As shown in FIG. 23, Modification 4-2 differs from basic structure 4 described above in that-the planar shape of an organic semiconductor layer 14 is smaller than that of an MTJ element 10, and the planar shape of a metal layer 20 is smaller than that of the organic semiconductor layer 14.

In Modification 4-2 of the fourth embodiment, it is possible to obtain not only the same effects as in basic structure 4, but also the same unique effects as in Modification 2-2 described earlier.

Note that in the structure shown in FIG. 23, the planar shape of the metal layer 20 is smaller than that of the organic semiconductor layer 14. However, the metal layer 20 may also have the same planar shape as the organic semiconductor layer 14.

(Modification 4-3)

FIG. 24 shows a magnetic memory device of Modification 4-3 according to the fourth embodiment of the present invention. As shown in FIG. 24, Modification 4-3 differs from basic structure 4 in that a barrier metal film 18 is formed between an organic semiconductor layer 14 and MTJ element 10.

A Schottky junction diode Ds1 is formed by the organic semiconductor layer 14 and a metal layer 20, and a Schottky junction diode Ds2 is formed by the organic semiconductor layer 14 and barrier metal film 18.

TiN, for example, forms a Schottky junction with a p-type Si semiconductor. Therefore, when the organic semiconductor layer 14 is made of a p-type Si semiconductor, TiN can be used as the material of the barrier metal film 18.

In Modification 4-3 of the fourth embodiment, it is possible to obtain not only the same effects as in basic structure 4, but also the same unique effects as in Modification 1-3 described previously.

Note that in this modification, the barrier metal film 18 is applied to basic structure 4 described above. However, the barrier metal film 18 may also be formed between the organic semiconductor layer 14 and MTJ element 10 in Modification 4-1 or 4-2. In this case, the barrier metal film 18 can have the same pattern as the MTJ element 10 or as the organic semiconductor layer 14, and can also have a pattern different from those of the MTJ element 10 and organic semiconductor layer 14.

[5] Fifth Embodiment

In the fifth embodiment, the materials and crystal states of the organic semiconductor layer in each embodiment will be explained.

(1) Materials

The organic semiconductor layer 14 can be made of a low-molecular material. A material presently being extensively used as the organic semiconductor layer 14 is pentacene which is a low-molecular material. Pentacene is a very superior material because it can singly form both n-and p-type semiconductors as described above, and it has high mobility and produces a large amount of electric current among other materials presently being used.

The organic semiconductor layer 14 can also be made of a high-molecular material. Unlike low-molecular materials, high-molecular materials such as polythiophene-based materials allow easy preparation of high-concentration solutions, and have high mass-productivity. Note that the formation of a high-concentration, high-molecular material requires no long-time vapor deposition, and this shortens the manufacturing time.

When the p-n junction diode Dpn is to be formed, the hole injection layer (p-type layer) of the organic semiconductor layer 14 is made of, e.g., CuPc, and the electron injection layer (n-type layer) of the organic semiconductor layer 14 is made of, e.g., a metal-complex-based organic material, PBD, or a triazole-based compound.

Note that the materials of the organic semiconductor layer 14 herein mentioned are presently general examples, so materials advantageous in, e.g., resistance and heat resistance can, of course, be developed and used in the future. Note also that any of the above-mentioned materials of the organic semiconductor layer 14 need only be contained in at least a portion of the organic semiconductor layer 14.

(2) Crystal States

The crystal state of the organic semiconductor layer 14 can be an amorphous state. The material, such as pentacene, of the organic semiconductor layer 14 is in an amorphous state when formed by coating. This amorphous state is advantageous in that no high-temperature formation which is the problem of the MRAM need not be performed because low-temperature formation is possible, although there is a slight problem that the mobility is low.

The crystal state of the organic semiconductor layer 14 can also be a single-crystal state. In this state, the number of formation annealing processes increases to pose a problem in viewpoint of the heat resistance of the MRAM and organic semiconductor, but the mobility advantageously rises.

The crystal state of the organic semiconductor layer 14 can also be a polycrystalline state. This state is intermediate between the amorphous state and single-crystal state, so the advantages of the two states can be well utilized. Therefore, the polycrystalline state presumably has the highest usability.

Note that at least a portion of the organic semiconductor layer 14 need only have any of the above crystal states.

[6] Sixth Embodiment

In the sixth embodiment, lamination type organic semiconductor layer fabrication methods will be described.

(Lamination Method 1)

FIGS. 25 to 28 illustrate the fabrication steps of organic semiconductor layer lamination method 1 according to the sixth embodiment of the present invention.

Figure 25:
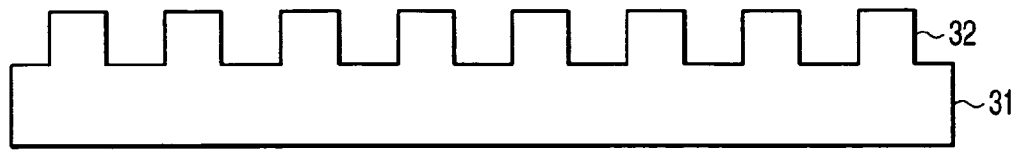
FIG. 25 is a sectional view showing the fabrication step of organic semiconductor layer lamination method 1 according to the sixth embodiment of the present invention.
Figure 26:
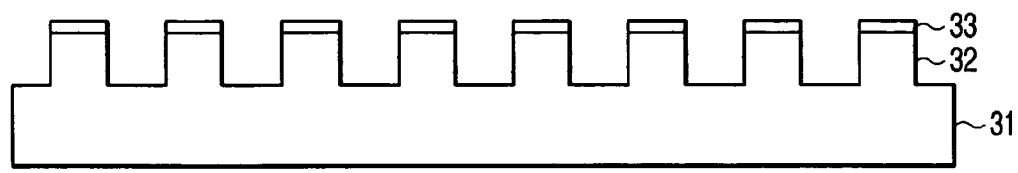
FIG. 26 is a sectional view, following FIG. 25, showing the fabrication step of organic semiconductor layer lamination method 1 according to the sixth embodiment of the present invention.
Figure 27:
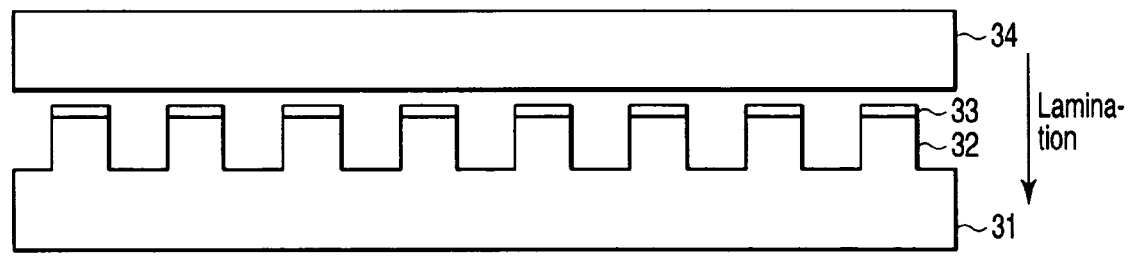
FIG. 27 is a sectional view, following FIG. 26, showing the fabrication step of organic semiconductor layer lamination method 1 according to the sixth embodiment of the present invention.
Figure 28:
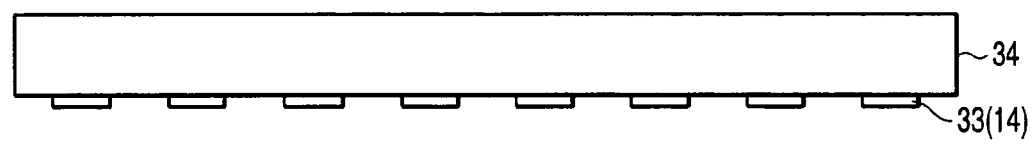
FIG. 28 is a sectional view, following FIG. 27, showing the fabrication step of organic semiconductor layer lamination method 1 according to the sixth embodiment of the present invention.

First, as shown in FIG. 25, the upper portion of an easily processable transfer substrate 31 is patterned to form projections 32 having fine patterns. As shown in FIG. 26, the upper surfaces of the projections 32 are coated with ink 33 made of an organic semiconductor material. This coating of the ink 33 is performed by laminating a substrate (not shown), the entire surface of which is coated with the ink, on the projections 32, or dipping the projections 32 into liquid ink. Subsequently, as shown in FIG. 27, a substrate 34 to undergo organic processing is laminated on the transfer substrate 31 to print the ink 33 on the substrate 34 in the same manner as stamping. Consequently, as shown in FIG. 28, an organic semiconductor layer 14 made of the ink 33 is formed on the substrate 34.

(Lamination Method 2)

FIGS. 29 to 32 illustrate the fabrication steps of organic semiconductor layer lamination method 2 according to the sixth embodiment of the present invention.

Figure 29:
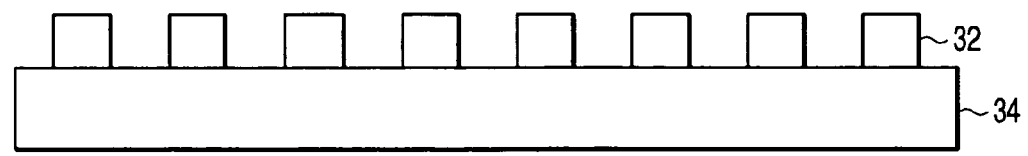
FIG. 29 is a sectional view showing the fabrication step of organic semiconductor layer lamination method 2 according to the sixth embodiment of the present invention.
Figure 30:
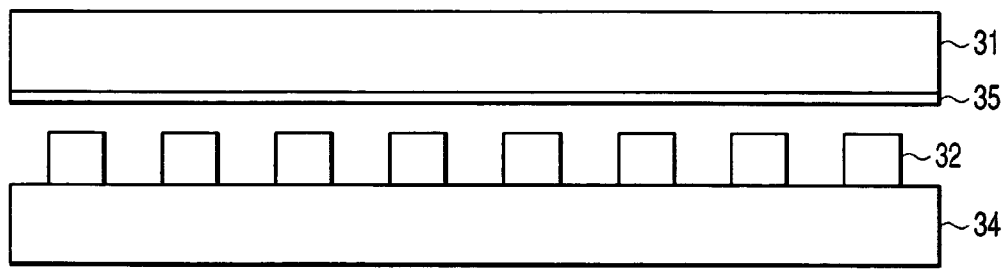
FIG. 30 is a sectional view, following FIG. 29, showing the fabrication step of organic semiconductor layer lamination method 2 according to the sixth embodiment of the present invention.
Figure 31:
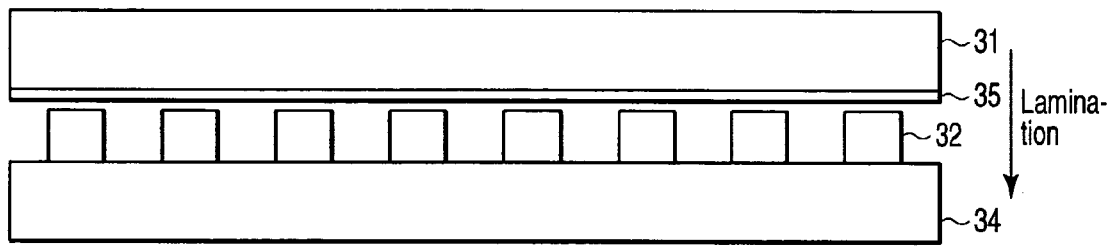
FIG. 31 is a sectional view, following FIG. 30, showing the fabrication step of organic semiconductor layer lamination method 2 according to the sixth embodiment of the present invention.
Figure 32:
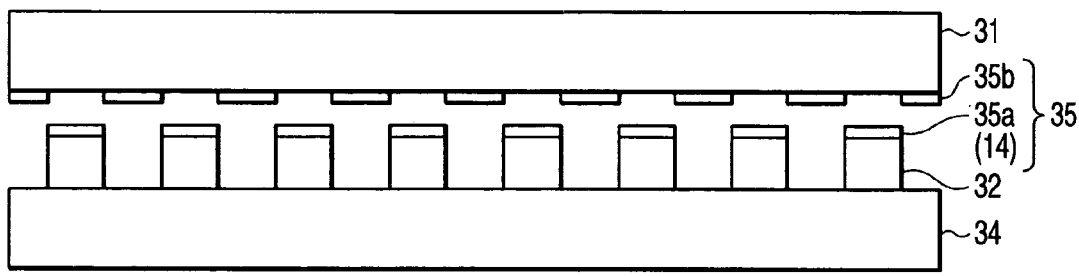
FIG. 32 is a sectional view, following FIG. 31, showing the fabrication step of organic semiconductor layer lamination method 2 according to the sixth embodiment of the present invention.

First, as shown in FIG. 29, projections 32 having fine patterns are formed on a substrate 34 to undergo organic processing. As shown in FIG. 30, the surface of a transfer substrate 31 is coated with ink 35 made of an organic semiconductor material. This coating of the ink 35 is performed by laminating a substrate (not shown), the entire surface of which is coated with the ink, on the transfer substrate 31, or dipping the transfer substrate into liquid ink. Subsequently, as shown in FIG. 31, the transfer substrate 31 is laminated on the projections 32. Consequently, as shown in FIG. 32, portions of the ink 35 on the transfer substrate 31 adhere to the projections 32 to form an organic semiconductor layer 14 made of ink 35*a* having desired patterns.

In lamination methods 1 and 2 of the sixth embodiment described above, the structure of the organic semiconductor layer 14 which is finely processed by self-alignment can be realized by processing the projections 32 into desired patterns of the organic semiconductor layer 14, and adhering the organic semiconductor material onto the projections 32.

[7] Seventh Embodiment

In the seventh embodiment, an inkjet-printer type organic semiconductor layer fabrication method will be described.

Figure 33:
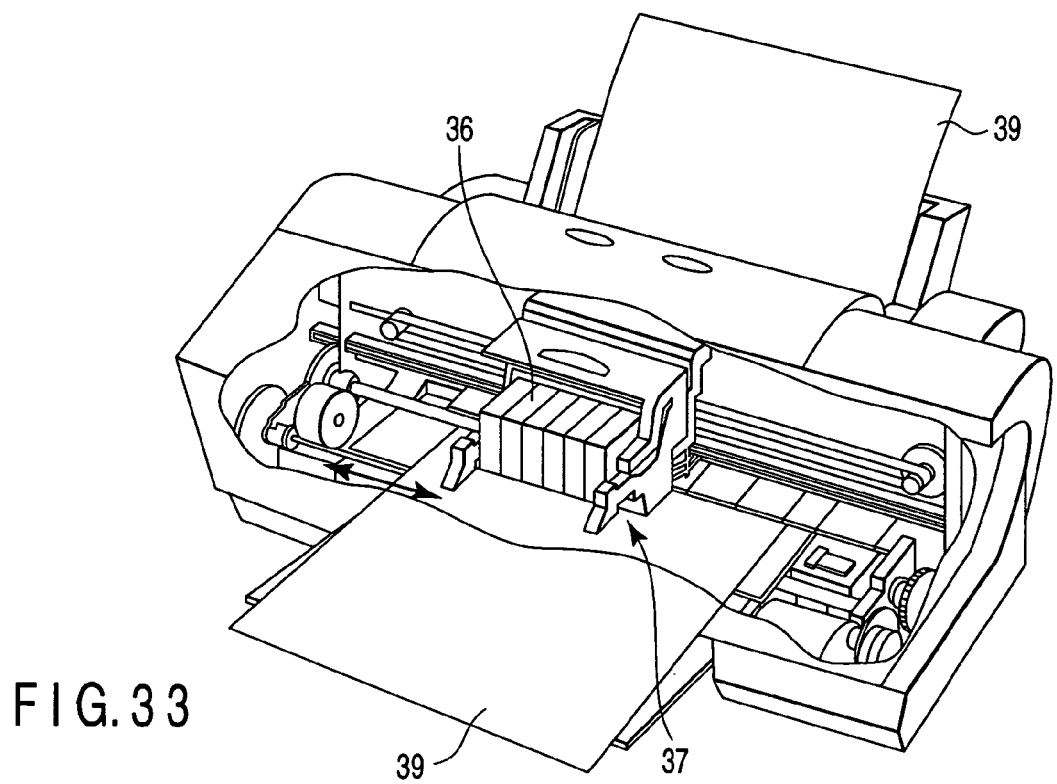
FIG. 33 is a schematic view showing an organic semiconductor layer inkjet-printer according to the seventh embodiment of the present invention.
Figure 34:
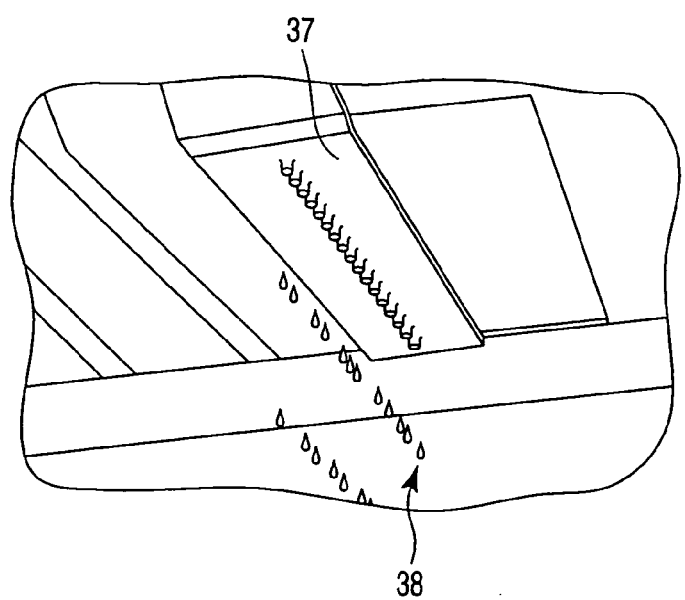
FIG. 34 is a schematic view showing an inkjet printhead according to the seventh embodiment of the present invention.

FIGS. 33 and 34 are views for explaining the inkjet-printer type organic semiconductor layer fabrication method according to the seventh embodiment of the present invention.

As shown in FIGS. 33 and 34, an inkjet-printer generally prints by moving an ink cartridge 36 and printhead 37 from side to side, and spraying droplets of ink 38 onto a sheet 39. In the seventh embodiment, an organic semiconductor layer 14 is formed by using the principle of the inkjet-printer printhead 37. That is, an organic semiconductor material such as a semiconductor high-molecular material is dissolved in a solution, and this solution is sprayed to predetermined portions by using the principle of the inkjet-printer printhead 37, thereby forming an organic semiconductor layer 14 having desired patterns.

Note that the principle of the inkjet-printer printhead 37 can form not only the organic semiconductor layer 14 but also semiconductor portions, such as a source/drain or electrodes, in fine regions by dissolving a conductive material or the like in a solution, and spraying this solution. However, caution should be exercised on "smearing" in order to prevent shortcircuits of individual portions.

In the inkjet-printer method of the seventh embodiment described above, the organic semiconductor layer 14 can be finely processed by using the principle of the inkjet-printer printhead 37.

[8] Eighth Embodiment

The first to fourth embodiments are explained by taking cross-point type MRAMs as examples. However, the present invention is not limited to this structure, and is also applicable to a stacked type MRAM.

In the eight embodiment, a p-n junction diode is formed below an MTJ element in a stacked type MRAM.

Figure 35:
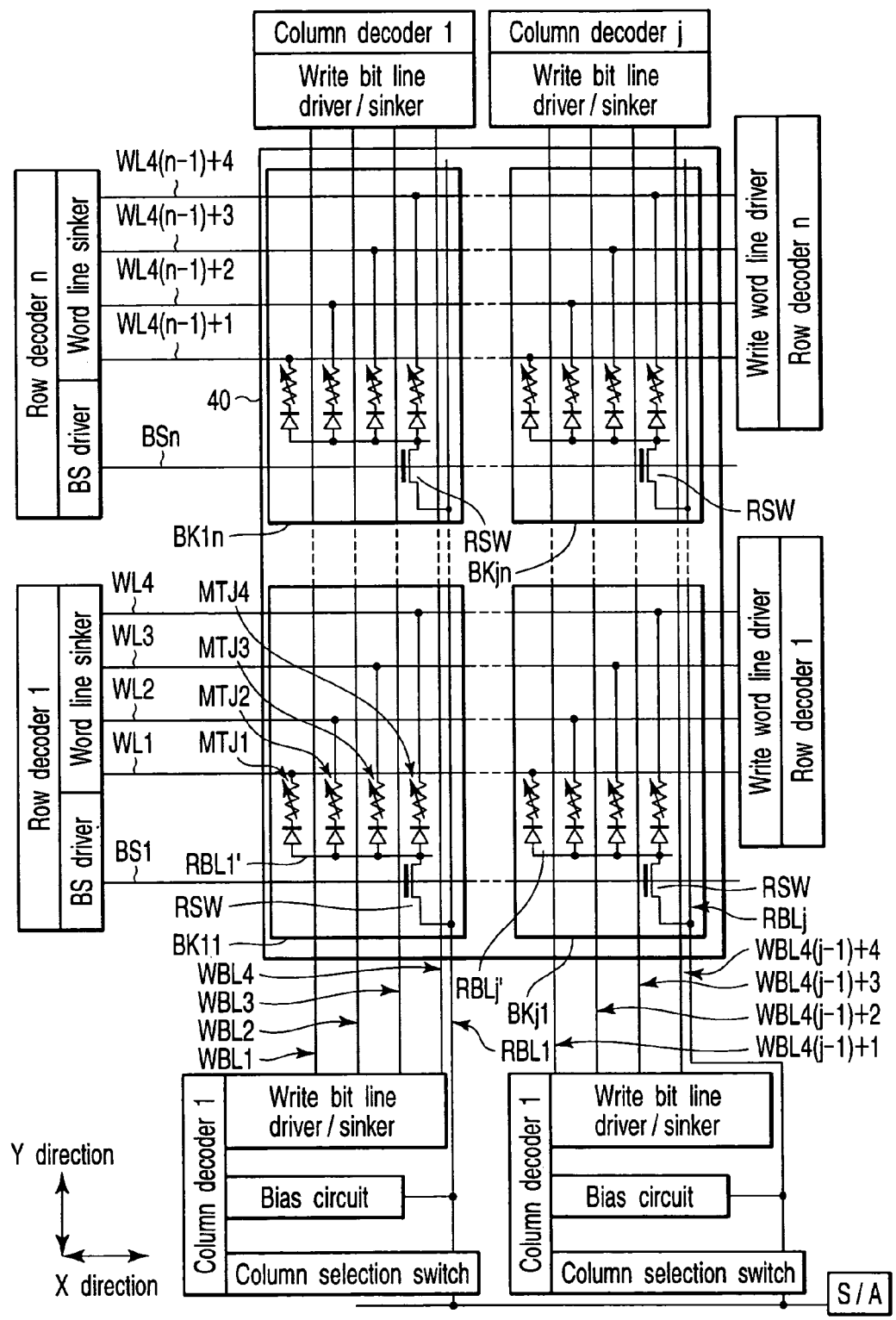
FIG. 35 is a schematic circuit diagram showing a stacked type magnetic memory device according to the eighth embodiment of the present invention.
Figure 36:
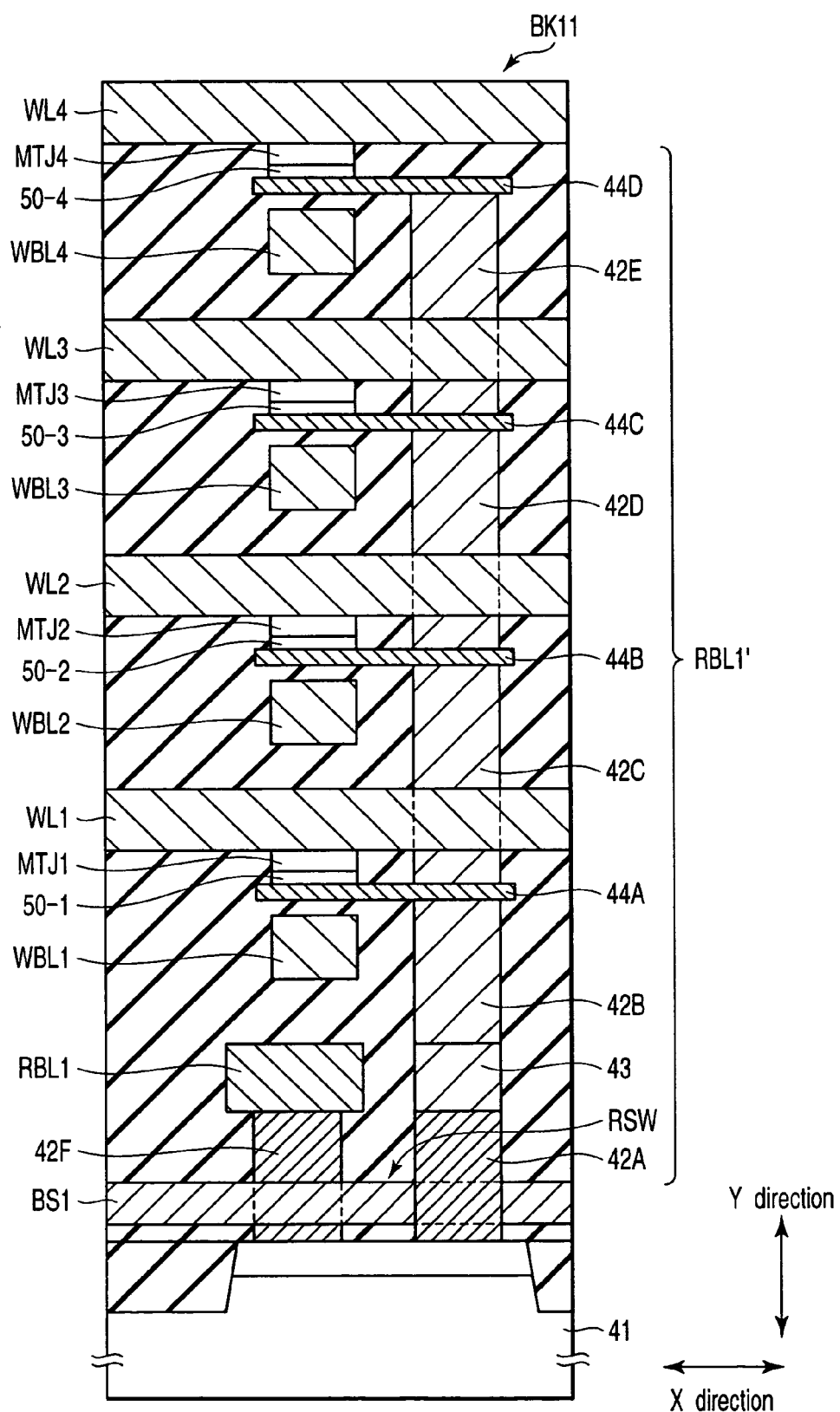
FIG. 36 is a sectional view showing the stacked type magnetic memory device according to the eighth embodiment.

FIGS. 35 and 36 illustrate the stacked type MRAM according to the eighth embodiment of the present invention. This stacked type MRAM will be explained below by taking a block BK11 as an example.

As shown in FIGS. 35 and 36, in the block BK11 of the stacked MRAM, a plurality of MTJ elements MTJ1, MTJ2, MTJ3, and MTJ4 are stacked on one read switching element (transistor) RSW, and connected to it. That is, the read switching element RSW is shared by the MTJ elements MTJ1, MTJ2, MTJ3, and MTJ4, and the block BK11 is formed by stacking the MTJ elements MTJ1, MTJ2, MTJ3, and MTJ4 in a direction (vertical direction) perpendicular to the surface of a semiconductor substrate 41.

In the block BK11, end portions on one side of the MTJ elements MTJ1, MTJ2, MTJ3, and MTJ4 are independently connected to word lines WL1, WL2, WL3, and WL4, respectively. The other ends of the MTJ elements MTJ1, MTJ2, MTJ3, and MTJ4 are connected together to a read sub bit line RBL1'. The read sub bit line RBL' is connected to a read main bit line RBL1 via the read switching element RSW. In this manner, a read bit line is divided into the main bit line RBL1 and sub bit line RBL1'. Write bit lines WBL1, WBL2, WBL3, and WBL4 are arranged below the MTJ elements MTJ1, MTJ2, MTJ3, and MTJ4, respectively.

In this stacked MRAM, p-n junction diodes made of organic semiconductor layers 50-1, 50-2, 50-3, and 50-4 are formed at the other ends of the MTJ elements MTJ1, MTJ2, MTJ3, and MTJ4, respectively. The upper and lower surfaces of the organic semiconductor layers 50-1, 50-2, 50-3, and 50-4 are connected to the MTJ elements MTJ1, MTJ2, MTJ3, and MTJ4 and lower metal layers 44A, 44B, 44C, and 44D, respectively. The planar shape of the organic semiconductor layers 50-1, 50-2, 50-3, and 50-4 is substantially the same as that of the MTJ elements MTJ1, MTJ2, MTJ3, and MTJ4.

In the eighth embodiment described above, the same effects as in basic structure 1 of the first embodiment can be obtained.

Note that the organic semiconductor layers 50-1, 50-2, 50-3, and 50-4 may also be arranged above the MTJ elements MTJ1, MTJ2, MTJ3, and MTJ4. It is also possible to use Schottky junction diodes including organic semiconductor layers, instead of the p-n junction diodes made of organic semiconductor layers. In addition, the planar shape of the organic semiconductor layers 50-1, 50-2, 50-3, and 50-4 can be made larger or smaller than that of the MTJ elements MTJ1, MTJ2, MTJ3, and MTJ4. In this embodiment, four MTJ elements are stacked in one block. However, the number of MTJ elements is not limited to four.

[9] Ninth Embodiment

The first to fourth embodiments are explained by taking cross point MRAMs as examples. In the ninth embodiment, a toggle type MRAM will be explained.

FIG. 37 is a plan view of the toggle type MRAM according to the ninth embodiment of the present invention. The cell structure of this toggle type MRAM will be described below.

As shown in FIG. 37, in a toggle type cell, an MTJ element 10 and organic semiconductor layer 14 are so formed that the easy axis of magnetization of the MTJ element 10 is inclined to the direction (X direction) in which a bit line 16 runs and to a direction (Y direction) in which a word line 15 runs, i.e., is inclined to directions in which write currents I1 and I2 of the bit line 16 or word line 15, respectively, flow. This inclination of the MTJ element 10 and organic semiconductor layer 14 is, e.g., about 30° to 60°, and desirably, about 45°. Also, a recording layer of the MTJ element 10 desirably has an interlayer exchange coupling structure (FIGS. 40A to 40H) made up of a ferromagnetic layer/non-magnetic layer/ferromagnetic layer.

As in the first and second embodiments, the organic semiconductor layer 14 may also be a p-n junction diode. Alternatively, as in the third and fourth embodiments, it is also possible to form a Schottky junction diode by additionally forming a metal layer 20 in contact with the organic semiconductor layer 14. In addition, the planar shapes of the MTJ element 10 and organic semiconductor layer 14 need not be the same. That is, as in the modifications of the first to fourth embodiments, the planar shape of the organic semiconductor layer 14 may also be larger or smaller than that of the MTJ element 10. Furthermore, as in the modifications of the first to fourth embodiments, a barrier metal film 18 may also be formed between the MTJ element 10 and organic semiconductor layer 14.

In the toggle type memory cell as described above, data write/read operations are performed as follows.

First, the write operation will be explained below. In toggle write, data in a selected cell is read out before arbitrary data is written in the selected cell. Therefore, no write operation is performed if it is found, when data is read out from the selected cell, that the arbitrary data is already written in the selected cell. If data different from the arbitrary data is written, data write is performed in order to rewrite the written data.

If it is necessary to write data in the selected cell after the confirmation cycle as described above, the two write lines (the bit line BL and word line WL) are turned on in order. After the write line which is turned on earlier is turned off, the write line which is turned on later is turned off. For example, this procedure is made up of four cycles, i.e., the word line W1 is turned on to supply a write current Iw2→the bit line BL is turned on to supply a write current Iw1→the word line WL is turned off to stop supplying the write current Iw2→the bit line BL is turned off to stop supplying the write current Iw1.

In the data read operation, on the other hand, data in a selected MTJ element 10 is read out by supplying electric currents to the bit line BL and word line WL connected to the MTJ element 10.

In the ninth embodiment described above, the same effects as in the first to fourth embodiments can be obtained.

[10] 10th Embodiment

In the cross-point type cells according to the first to fourth embodiments described above, the bit line and word line are used in both read and write operations. However, the present invention is not limited to these embodiments. In the 10th embodiment, a split cell in which a word line is split into a write word line and read word line will be described.

Figure 38A:
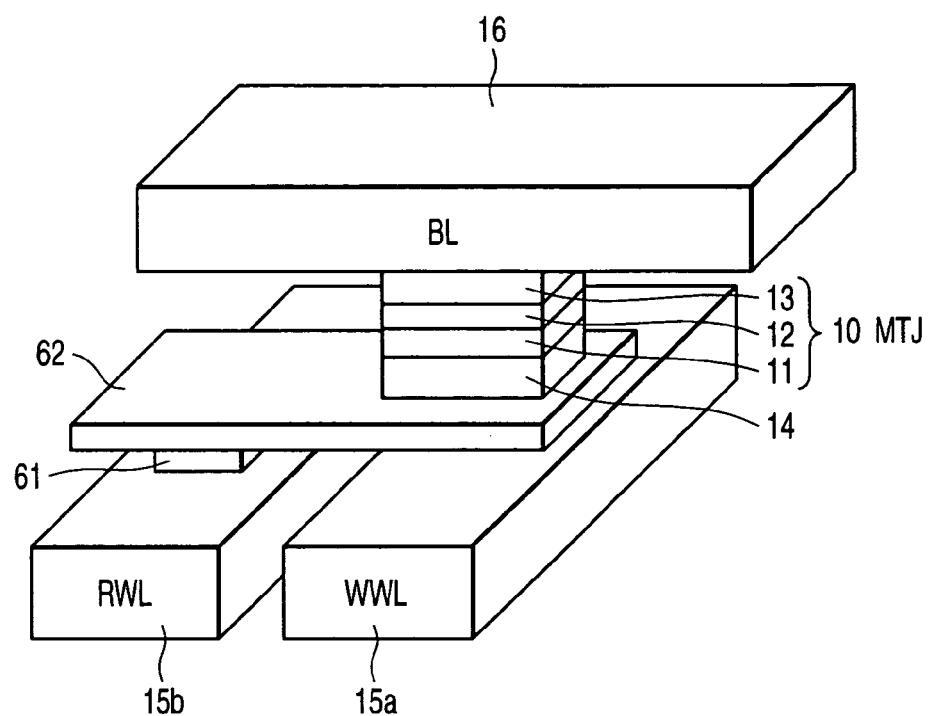
FIGS. 38A and 38B are perspective views showing a split magnetic memory device according to the 10th embodiment of the present invention.
Figure 38B:
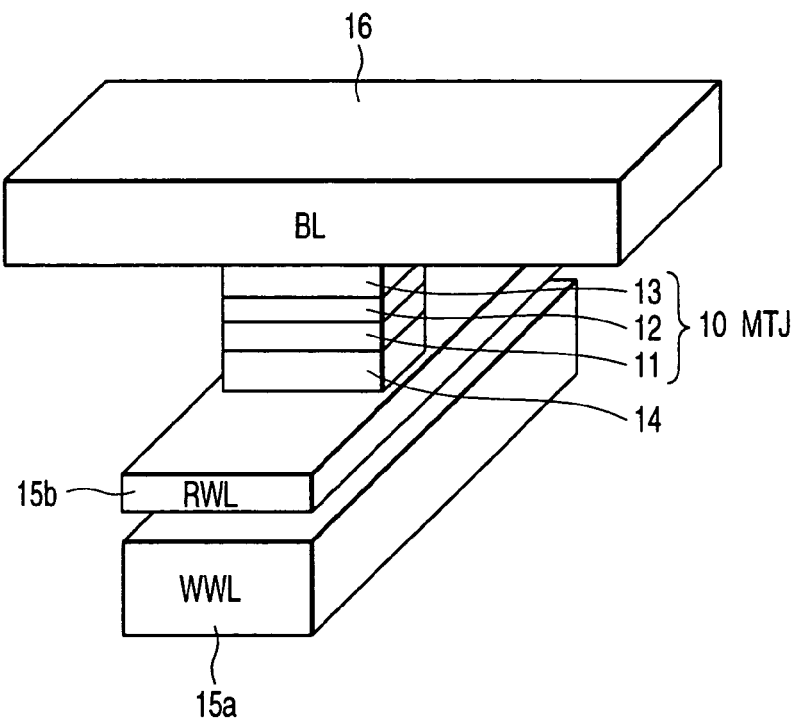

FIGS. 38A and 38B are perspective views of a split MRAM according to the 10th embodiment of the present invention. The cell structure of this split MRAM will be explained below.

As shown in FIGS. 38A and 38B, a word line is split into a write word line (WWL) 15a and read word line (RWL) 15b. The word line 15a is electrically isolated from an MTJ element 10, and the read word line 15b is electrically connected to the MTJ element 10.

Details of the structure shown in FIG. 38A are as follows. The write word line 15a is formed below the MTJ element 10 so as to be separated from an organic semiconductor layer 14, and runs in, e.g., a direction perpendicular to a bit line 16. The read word line 15b is formed on the same plane as the write word line 15a so as to be separated from the write word line 15a, and runs in a direction parallel to the write word line 15a. The read word line 15b is connected to the organic semiconductor layer 14 via a contact 61 and metal layer 62.

Details of the structure shown in FIG. 38B are as follows. The write word line 15a is separated from the organic semiconductor layer 14 below the MTJ element 10, and runs in, e.g., the direction perpendicular to the bit line 16. The read word line 15b is formed above the write word line 15a so as to be separated from it, and runs in the direction parallel to this write word line 15a. The read word line 15b is in contact with the organic semiconductor layer 14.

As in the first and second embodiments, the organic semiconductor layer 14 may also be a p-n junction diode. As in the third and fourth embodiments, a metal layer 20 in contact with the organic semiconductor layer 14 may also be additionally formed to form a Schottky junction diode. The organic semiconductor layer 14 can be formed below or above the MTJ element 10. The planar shapes of the MTJ element 10 and organic semiconductor layer 14 need not be the same. As in the modifications of the first to fourth embodiments, the planar shape of the organic semiconductor layer 14 can be larger or smaller than that of the MTJ element 10. Also, as in the modifications of the first to fourth embodiments, a barrier metal film 18 can be formed between the MTJ element 10 and organic semiconductor layer 14.

In the 10th embodiment described above, the same effects as in the first to fourth embodiments can be obtained.

In addition, in the 10th embodiment, a word line is split into the write word line 15a and read word line 15b. Therefore, compared to the simple cross point structures as in the first to fourth embodiments, it is possible to obtain a large read signal and increase the read rate. Furthermore, since the write line and read line are partially separated, it is possible to eliminate a voltage bias applied to a tunnel junction layer 12 during data write, and improve the reliability.

[11] 11th Embodiment

In the 11th Embodiment, MTJ elements will be described in detail. Various MTJ elements to be explained in the 11th embodiment can, of course, be applied to the other embodiments.

(1) Planar Shapes

FIGS. 39A to 39G are plan views of MTJ elements according to the 11th embodiment of the present invention. Examples of the planar shapes of these MTJ elements will be described below. Note that the MTJ elements can naturally take shapes other than those shown in FIGS. 39A to 39G.

Figure 39A:
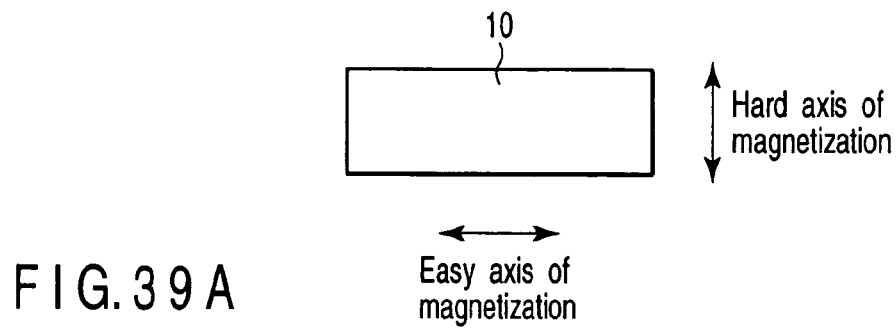
FIGS. 39A to 39G are plan views showing the planar shapes of MTJ elements according to the 11th embodiment of the present invention.
Figure 39B:
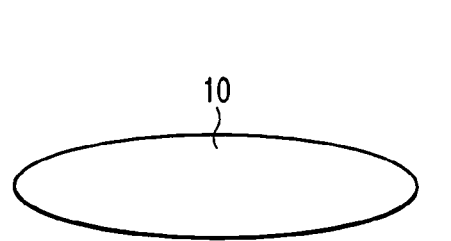
Figure 39C:
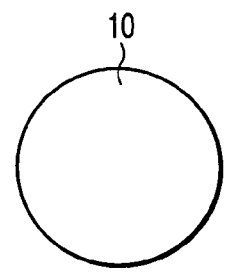
Figure 39D:
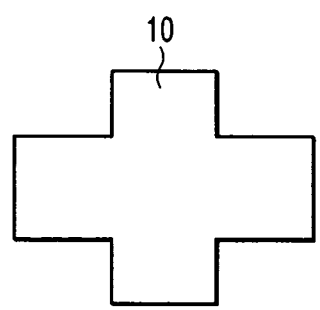
Figure 39E:
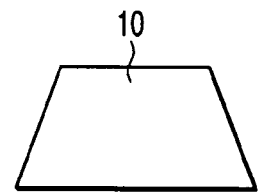
Figure 39F:
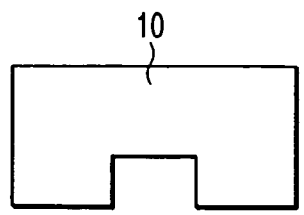
Figure 39G:
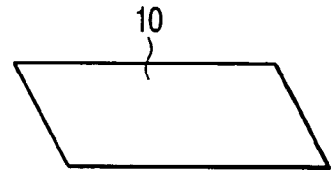

As shown in FIG. 39A, the planar shape of an MTJ element 10 is, e.g., a rectangle. In this rectangle, the longitudinal direction is the easy axis of magnetization, and the direction perpendicular to this longitudinal direction is the hard axis of magnetization. The planar shape of the MTJ element 10 can also be, e.g., an ellipse (FIG. 39B), circle (FIG. 39C), cross (FIG. 39D), trapezoid (FIG. 39E), bean (recess) (FIG. 39F), or parallelogram (FIG. 39G).

When the MTJ element 10 is formed in a memory cell, the easy axis of magnetization of the MTJ element 10 can be pointed in the direction in which a bit line runs, or in the direction in which a word line runs.

(2) Interlayer Exchange Coupling Structures

FIGS. 40A to 40H are sectional views of the interlayer exchange coupling structures of MTJ elements according to the 11th embodiment of the present invention. The interlayer exchange coupling structures of these MTJ elements will be described below.

As shown in FIGS. 40A to 40H, in an MTJ element 10, at least one of a fixed layer 11 and free layer 13 can have an antiferromagnetic coupling structure or ferromagnetic coupling structure. The antiferromagnetic coupling structure is an interlayer exchange coupling structure in which the magnetization directions of two ferromagnetic layers sandwiching a non-magnetic layer are antiparallel. The ferromagnetic coupling structure is an interlayer exchange coupling structure in which the magnetization directions of two ferromagnetic layers sandwiching a non-magnetic layer are parallel.

Figure 40A:
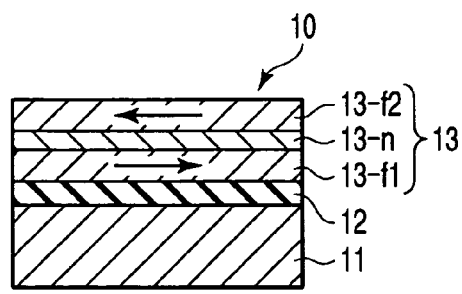
FIGS. 40A to 40H are sectional views showing MTJ elements having interlayer exchange coupling structures according to the 11th embodiment of the present invention.

In an MTJ element 10 shown in FIG. 40A, a free layer 13 has the antiferromagnetic coupling structure. That is, the free layer 13 has three layers, i.e., a ferromagnetic layer 13-f1/non-magnetic layer 13-n/ferromagnetic layer 13-f2, and the ferromagnetic layers 13-f1 and 13-f2 magnetically couple such that their magnetization directions are antiparallel.

Figure 40B:
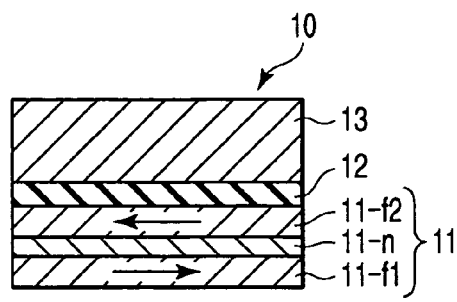

In an MTJ element 10 shown in FIG. 40B, a fixed layer 11 has the antiferromagnetic coupling structure. That is, the fixed layer 11 has three layers, i.e., a ferromagnetic layer 11-f1/non-magnetic layer 11-n/ferromagnetic layer 11-f2, and the ferromagnetic layers 11-f1 and 11-f2 magnetically couple such that their magnetization directions are antiparallel.

Figure 40C:
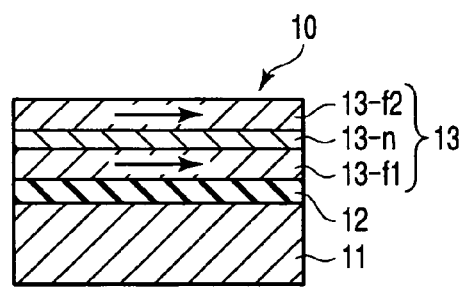

In an MTJ element 10 shown in FIG. 40C, a free layer 13 has the ferromagnetic coupling structure. That is, the free layer 13 has three layers, i.e., a ferromagnetic layer 13-f1/non-magnetic layer 13-n/ferromagnetic layer 13-f2, and the ferromagnetic layers 13-f1 and 13-f2 magnetically couple such that their magnetization directions are parallel.

Figure 40D:
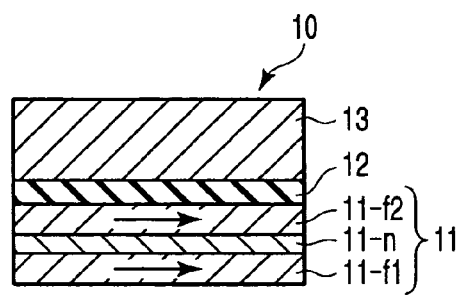

In an MTJ element 10 shown in FIG. 40D, a fixed layer 11 has the ferromagnetic coupling structure. That is, the fixed layer 11 has three layers, i.e., a ferromagnetic layer 11-f1/non-magnetic layer 11-n/ferromagnetic layer 11-f2, and the ferromagnetic layers 11-f1 and 11-f2 magnetically couple such that their magnetization directions are parallel.

Figure 40E:
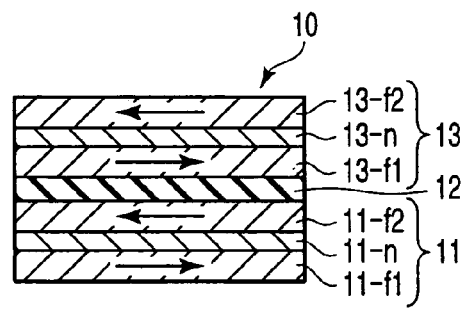

In an MTJ element 10 shown in FIG. 40E, both a free layer 13 and fixed layer 11 have the antiferromagnetic coupling structure. That is, the free layer 13 has three layers, i.e., a ferromagnetic layer 13-f1/non-magnetic layer 13-n/ferromagnetic layer 13-f2, and the ferromagnetic layers 13-f1 and 13-f2 magnetically couple such that their magnetization directions are antiparallel. Also, the fixed layer 11 has three layers, i.e., a ferromagnetic layer 11-f1/non-magnetic layer 11-n/ferromagnetic layer 11-f2, and the ferromagnetic layers 11-f1 and 11-f2 magnetically couple such that their magnetization directions are antiparallel.

Figure 40F:
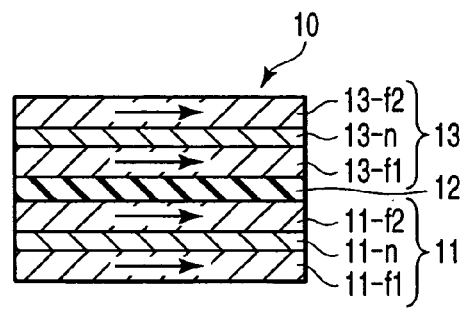

In an MTJ element 10 shown in FIG. 40F, both a free layer 13 and fixed layer 11 have the ferromagnetic coupling structure. That is, the free layer 13 has three layers, i.e., a ferromagnetic layer 13-f1/non-magnetic layer 13-n/ferromagnetic layer 13-f2, and the ferromagnetic layers 13-f1 and 13-f2 magnetically couple such that their magnetization directions are parallel. Also, the fixed layer 11 has three layers, i.e., a ferromagnetic layer 11-f1/non-magnetic layer 11-n/ferromagnetic layer 11-f2, and the ferromagnetic layers 11-f1 and 11-f2 magnetically couple such that their magnetization directions are parallel.

Figure 40G:
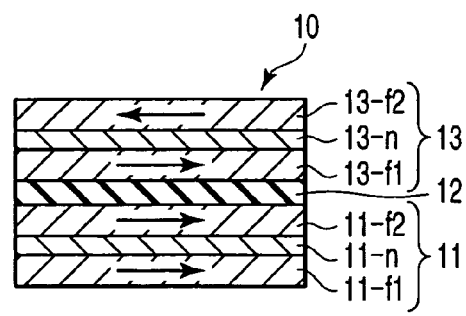

In an MTJ element 10 shown in FIG. 40G, a free layer 13 has the antiferromagnetic coupling structure, and a fixed layer 11 has the ferromagnetic structure. That is, the free layer 13 has three layers, i.e., a ferromagnetic layer 13-f1/non-magnetic layer 13-n/ferromagnetic layer 13-f2, and the ferromagnetic layers 13-f1 and 13-f2 magnetically couple such that their magnetization directions are antiparallel. Also, the fixed layer 11 has three layers, i.e., a ferromagnetic layer 11-f1/non-magnetic layer 11-n/ferromagnetic layer 11-f2, and the ferromagnetic layers 11-f1 and 11-f2 magnetically couple such that their magnetization directions are parallel.

Figure 40H:
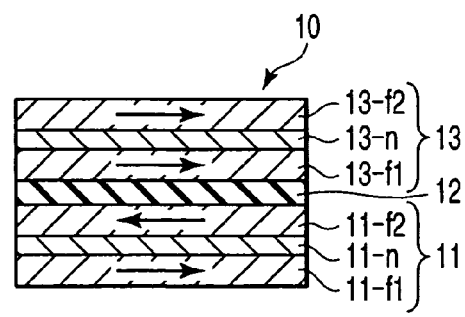

In an MTJ element 10 shown in FIG. 40H, a free layer 13 has the ferromagnetic coupling structure, and a fixed layer 11 has the antiferromagnetic coupling structure. That is, the free layer 13 has three layers, i.e., a ferromagnetic layer 13-f1/non-magnetic layer 13-n/ferromagnetic layer 13-f2, and the ferromagnetic layers 13-f1 and 13-f2 magnetically couple such that their magnetization directions are parallel. Also, the fixed layer 11 has three layers, i.e., a ferromagnetic layer 11-f1/non-magnetic layer 11-n/ferromagnetic layer 11-f2, and the ferromagnetic layers 11-f1 and 11-f2 magnetically couple such that their magnetization directions are antiparallel.

Note that each of FIGS. 40A to 40H is explained by taking an MTJ element 10 having a single tunnel junction structure as an example. However, the present invention is, of course, also applicable to an MTJ element 10 having a double tunnel junction structure. Note also that the layers forming each of the fixed layer 11 and free layer 13 are not limited to three layers, i.e., a ferromagnetic layer/non-magnetic layer/ferromagnetic layer. That is, it is also possible to further increase the number of layers.

(3) Sectional Shapes

Figure 41A:
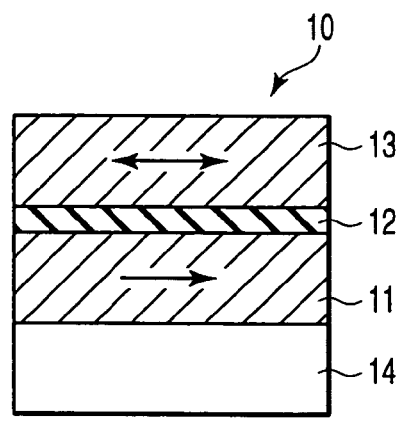
FIGS. 41A to 41C are sectional views showing the sectional shapes of MTJ elements according to the 11th embodiment of the present invention.
Figure 41B:
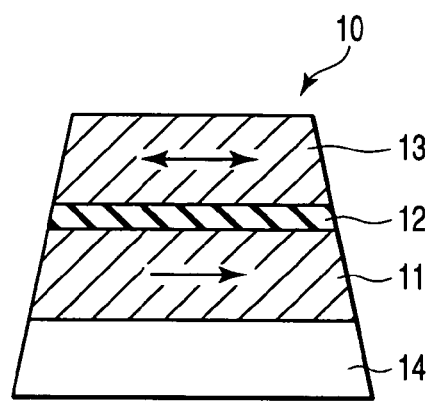
Figure 41C:
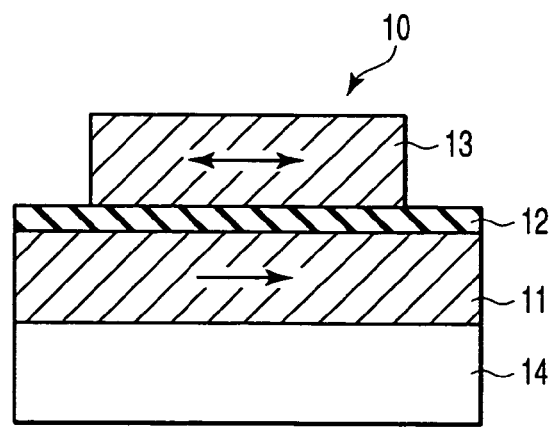

FIGS. 41A to 41C are sectional views of MTJ elements according to the 11th embodiment of the present invention. The sectional shapes of these MTJ elements will be explained below.

The MTJ element 10 can have a sectional shape in which the side surfaces of all the organic semiconductor layer 14, fixed layer 11, tunnel junction layer 12, and free layer 13 continue with no steps between them (FIGS. 41A and 41B), or a sectional shape in which the side surfaces of the organic semiconductor layer 14, fixed layer 11, tunnel junction layer 12, and free layer 13 form a discontinuous uneven shape (FIG. 41C).

When the MTJ element 10 shown in FIG. 41A is viewed from its upper surface, the planar shapes of all the organic semiconductor layer 14, fixed layer 11, tunnel junction layer 12, and free layer 13 are the same.

When the MTJ element 10 shown in FIG. 41B is viewed from its upper surface, the planar shape size decreases in the order of the organic semiconductor layer 14, fixed layer 11, tunnel junction layer 12, and free layer 13. That is, this sectional shape is a trapezoid.

The sectional shape shown in FIG. 41C is a projecting shape. When the MTJ element 10 shown in FIG. 41C is viewed from its upper surface, the planar shapes of the organic semiconductor layer 14, fixed layer 11, and tunnel junction layer 12 are larger than those of the free layer 13.

(4) Materials

As the material of the fixed layer 11 and free layer 13, it is preferable to use, e.g., Fe, Co, Ni, or an alloy of any of these metals, magnetite having high spin polarizability, an oxide such as $CrO_2$ or $RXMnO_{3-Y}$ (R; rare earth element, X; Ca, Ba, or Sr), or a Heusler alloy such as NiMbSb or PtMnSb. These magnetic materials can also contain slight amounts of non-magnetic elements, such as Ag, Cu, Au, Al, Mg, Si, Bi, Ta, B, C, O, N, Pd, Pt, Zr, Ir, W, Mo, and Nb, provided that ferromagnetism is not lost.

As the material of the tunnel junction layer 12, it is possible to use various dielectric materials such as $Al_2O_3$, $SiO_2$, MgO, AlN, $Bi_2O_3$, $MgF_2$, $CaF_2$, $SrTiO_2$, and $AlLaO_3$. These dielectric materials can have oxygen, nitrogen, and fluorine defects.

Note that an antiferromagnetic layer for fixing the magnetization of the fixed layer 11 can also be formed in contact with the fixed layer 11. The material of this antiferromagnetic layer is preferably Fe—Mn, Pt—Mn, Pt—Cr—Mn, Ni—Mn, Ir—Mn, NiO, or $Fe_2O_3$.

The present invention is not limited to the above embodiments, and can be variously modified as follows when practiced without departing from the spirit and scope of the invention.

(1) The organic semiconductor layer forming a p-n junction diode or Schottky junction diode can be formed not only on one of the upper and lower surfaces of the MTJ element, but also on both the upper and lower surfaces of the MTJ element.

(2) The present invention according to each embodiment is applicable not only to the MRAM, but also to various resistance change memories such as an OUM (Ovonic Unified Memory) and RRAM (Resistance Random Access Memory).

Figure 42:
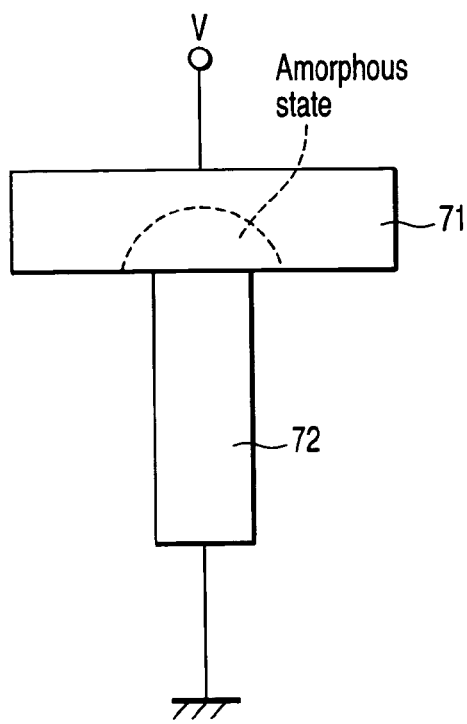
FIG. 42 is a schematic sectional view showing an OUM according to each embodiment of the present invention.
Figure 43:
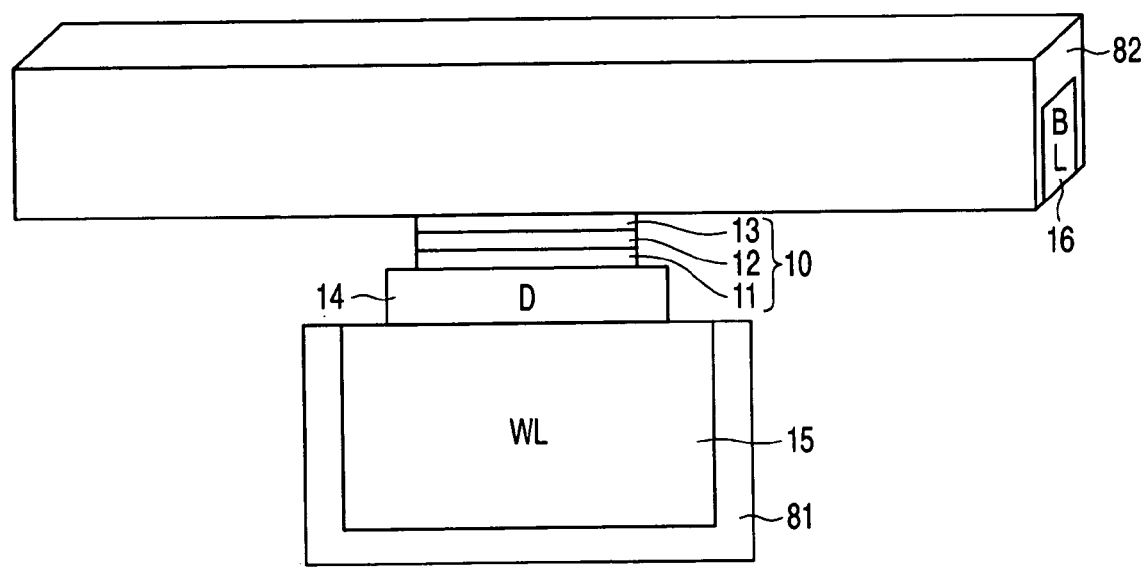
FIGS. 43 to 46 are perspective views showing the magnetic memory device having a yoke layer according to each embodiment of the present invention.

As shown in FIG. 42, a cell of the OUM includes a phase change film 71 which functions as a memory element, and a resistance element 72 for heating. The phase change film 71 is made of a chalcogenide alloy. This chalcogenide alloy increases the resistance value in an amorphous (non-crystal) state, and decreases the resistance value in a crystal state. Therefore, binary data "1" and "0" can be stored by switching these two states. That is, in the MRAM, the resistance value is changed by the combination of the directions of magnetic fields generated in accordance with the directions of electric currents. In the OUM, the resistance value is changed by switching the amorphous state and crystal state by heat. In this OUM, an organic semiconductor layer is desirably formed in contact with that surface of the phase change film 71, which opposes the resistance element 72 (i.e., between the phase change film 71 and resistance element 72), or in contact with a surface opposite to that surface of the phase change film 71, which opposes the resistance element 72.

A cell of the RRAM uses a CMR (Colossal Magneto Resistive) element as a memory element. The write system of the RRAM is a voltage driving system. The resistance value is changed by applying voltages in difference directions to the CMR element. This RRAM does not cause any thermal decay, which results from micropatterning, during data write, does not increase the current consumption, and requires no write lines. In this RRAM, an organic semiconductor layer is desirably formed in contact with the CMR element.

(3) In each embodiment, the diode D and the MTJ element 10 are stacked. Therefore, a distance of between the MTJ element 10 and the word line 15 or between the MTJ element 10 and the bit line 16 is long. Then, yoke layers 81 and 82 may be arranged around at least one of the word line 15 and the bit line 16 (FIGS. 43 to 46).

Figure 44:
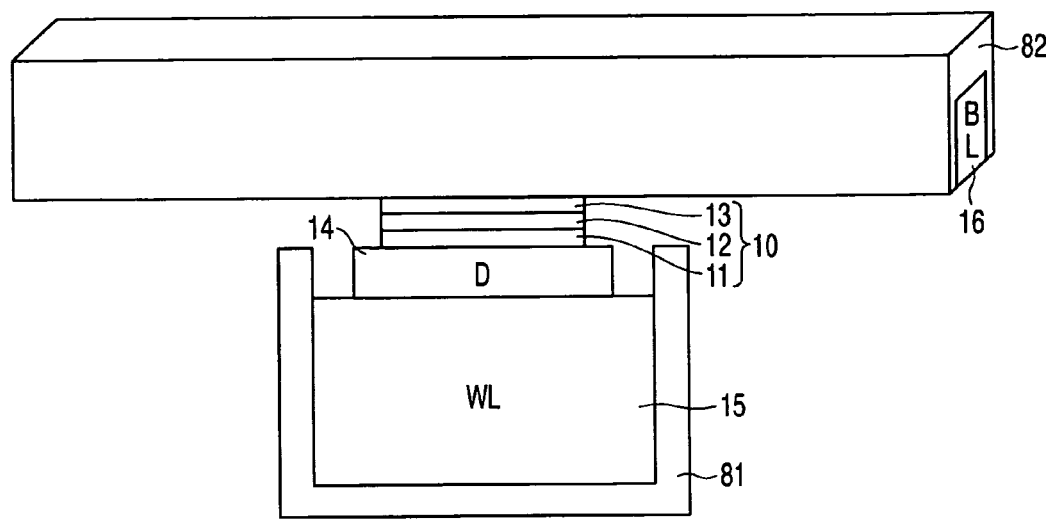

For example, as shown in FIG. 44, when the diode D is arranged between the word line 15 and the MTJ element 10, the yoke layer 81 is projected from an upper surface of the word line 15 and may be extended around the diode D. Consequently, the yoke layer 81 can be brought near to the MTJ element 10.

Figure 45:
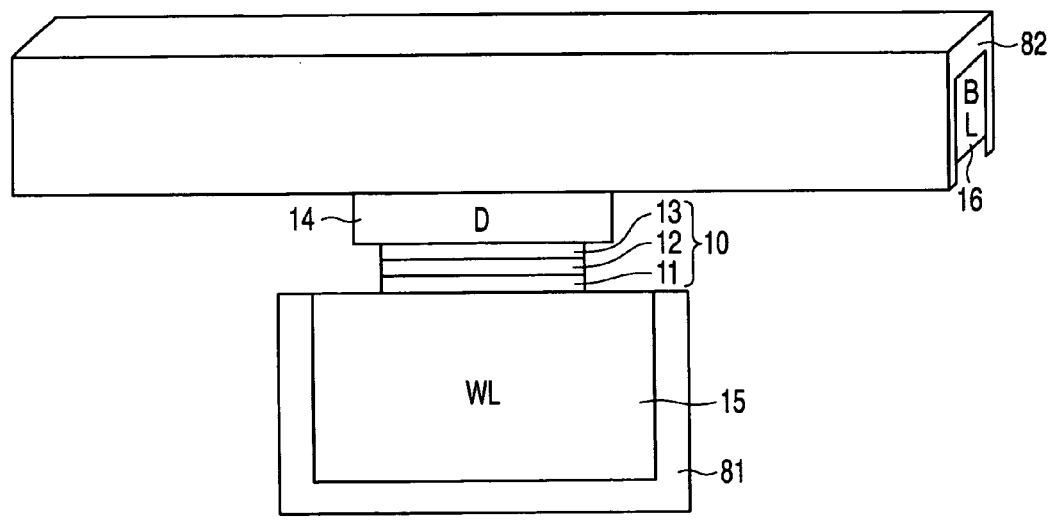

Also, as shown in FIG. 45, when the diode D is arranged between the bit line 16 and the MTJ element 10, the yoke layer 82 is projected from a bottom surface of the bit line 16 and may be extended around the diode D. Consequently, the yoke layer 82 can be brought near to the MTJ element 10.

Figure 46:
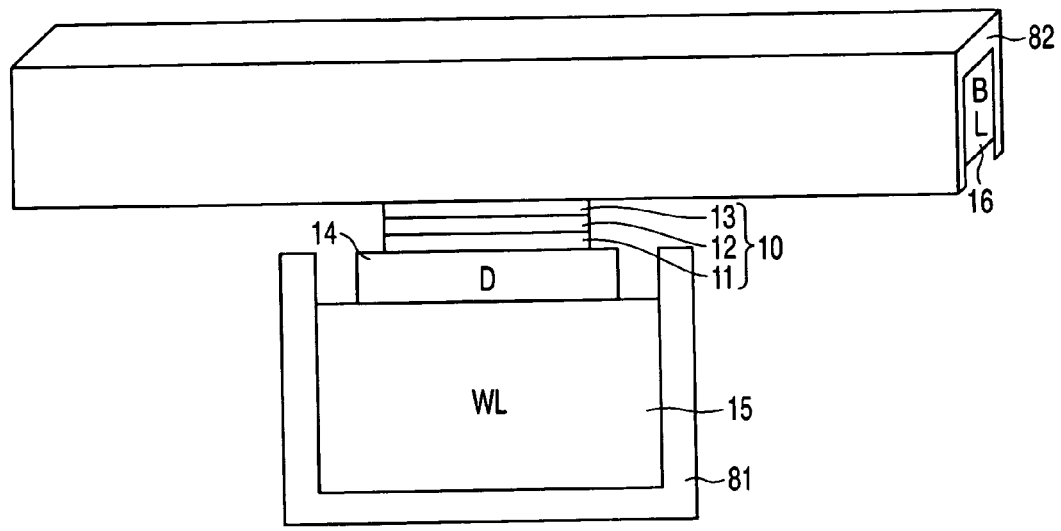
Figure 47:
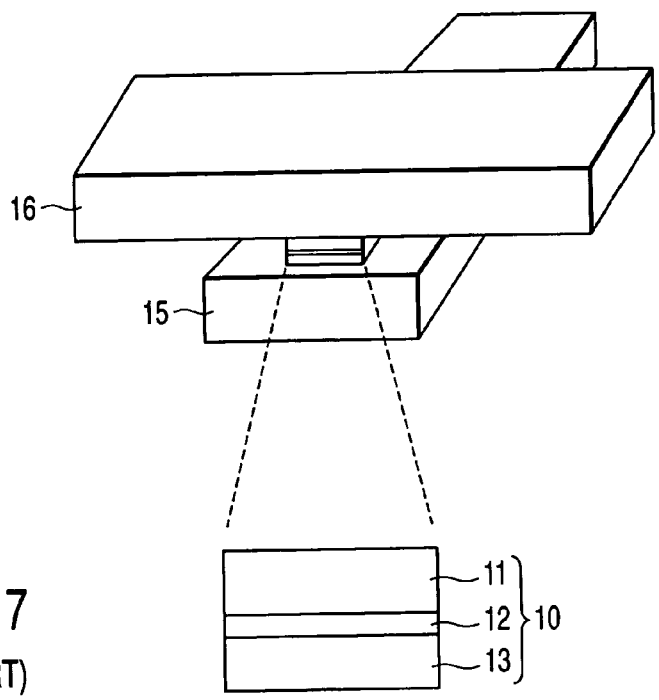
FIG. 47 is a perspective view showing a cross-point type magnetic memory device according to the prior art.
Figure 48:
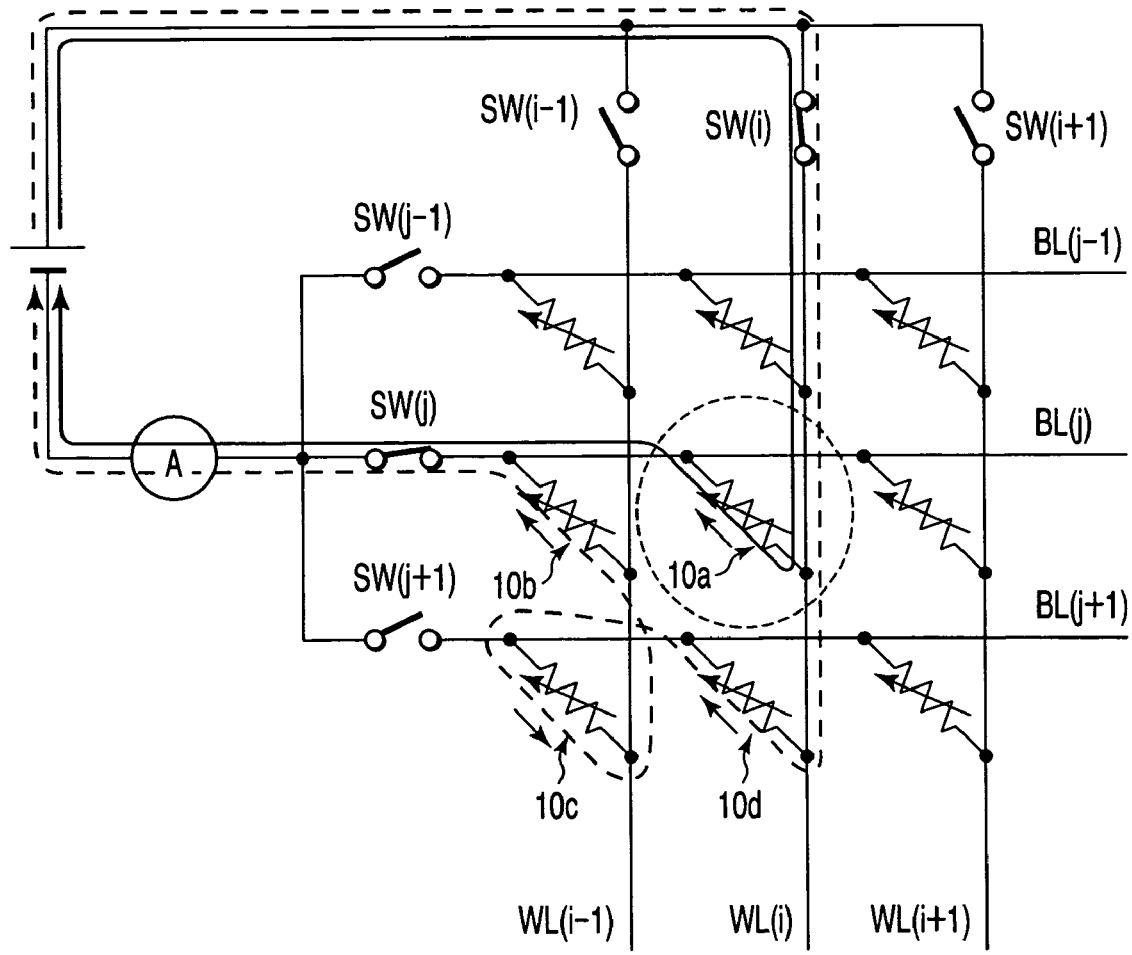
FIG. 48 is a view showing the problem of a sneak current in the cross-point type magnetic memory device according to the prior art.

Also, as shown in FIG. 46, the yoke layers 81 and 82 may be brought near to the MTJ element 10.

According to the structure shown in FIGS. 43 to 46, the yoke layers 81 and 82 are arranged. Therefore, an efficiency of the magnetic field can be improved, and it is possible to reduce the write current.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A resistance change memory comprising:
   a memory element being a magnetoresistive effect element and having at least first and second magnetic layers, and a non-magnetic layer formed between the first and second magnetic layers; and a first organic semiconductor layer being in contact with the memory element and having first and second surfaces, and the first surface being in contact with the first magnetic layer, wherein at least a portion of the first organic semiconductor layer is formed of one of a low-molecular material, high-molecular material, pentacene, CuPc, polythiophene-based material, metal-complex-based organic material, PBD, and triazole-based compound.

2. The memory according to claim 1, wherein the first organic semiconductor layer forms a p-n junction diode.

3. A resistance change memory comprising:
a memory element being a magnetoresistive effect element and having at least first and second magnetic layers, and a non-magnetic layer formed between the first and second magnetic layers;
a first organic semiconductor layer being in contact with the memory element and having first and second surfaces, and the first surface being in contact with the first magnetic layer; and
a first metal layer in contact with the second surface, and wherein the first organic semiconductor layer and first magnetic layer form a first Schottky junction diode, and the first organic semiconductor layer and first metal layer form a second Schottky junction diode.

4. The memory according to claim 1, further comprising:
a first wiring which runs in a first direction, and is connected to the second magnetic layer; and
a second wiring which runs in a second direction different from the first direction, and is connected to the second surface.

5. A resistance change memory comprising:
a memory element being a magnetoresistive effect element and having at least first and second magnetic layers, and a non-magnetic layer formed between the first and second magnetic layers;
a first organic semiconductor layer being in contact with the memory element and having first and second surfaces, and the first surface being in contact with the first magnetic layer; and
in which a plurality of elements each having the magnetoresistive effect element and first organic semiconductor layer are arranged in a direction perpendicular to a substrate, and
which further comprises:
a plurality of first wirings connected to ends of the elements,
a second wiring which connects other ends of the elements, and
a switching element connected to the second wiring.

6. The memory according to claim 1, which further comprises:
a first wiring which runs in a first direction, and is connected to the second magnetic layer; and
a second wiring which runs in a second direction different from the first direction, and is connected to the second surface, and
in which an easy axis of magnetization of the magnetoresistive effect element inclines through 30° to 60° to the first or second direction.

7. The memory according to claim 1, further comprising:
first and second write wirings sandwiching the magnetoresistive effect element, the first write wiring running in a first direction, the second write wiring running in a second direction different from the first direction, the first write wiring being connected to the second magnetic layer, and the second write wiring being separated from the second surface of the first organic semiconductor layer; and
a read wiring which runs in the second direction, and is electrically connected to the magnetoresistive effect element.

8. The memory according to claim 1, wherein the first organic semiconductor layer is formed below the magnetoresistive effect element.

9. The memory according to claim 1, wherein the first organic semiconductor layer is formed above the magnetoresistive effect element.

10. The memory according to claim 1, wherein a planar shape of the first organic semiconductor layer is substantially the same as a planar shape of the magnetoresistive effect element.

11. The memory according to claim 1, wherein a planar shape of the first organic semiconductor layer is larger than a planar shape of the magnetoresistive effect element.

12. The memory according to claim 1, wherein a planar shape of the first organic semiconductor layer is smaller than a planar shape of the magnetoresistive effect element.

13. The memory according to claim 1, further comprising a barrier metal film formed between the first organic semiconductor layer and first magnetic layer.

14. The memory according to claim 1, further comprising a second organic semiconductor layer in contact with the second magnetic layer.

15. The memory according to claim 1, wherein the memory element is formed of a phase change film.

16. The memory according to claim 1, wherein the memory element is a CMR element.

* * * * *